US012618661B2

(12) United States Patent
Lassalle-Balier et al.

(10) Patent No.: US 12,618,661 B2
(45) Date of Patent: May 5, 2026

(54) REDUCING STRAY MAGNETIC FIELD EFFECT ON AN ANGLE SENSOR

(71) Applicant: Allegro MicroSystems, LLC, Manchester, NH (US)

(72) Inventors: Rémy Lassalle-Balier, Bures sur Yvette (FR); Jean-Michel Daga, Bourg-la-Reine (FR)

(73) Assignee: Allegro MicroSystems, LLC, Manchester, NH (US)

( * ) Notice: Subject to any disclaimer, the term of this patent is extended or adjusted under 35 U.S.C. 154(b) by 381 days.

(21) Appl. No.: 18/162,780

(22) Filed: Feb. 1, 2023

(65) Prior Publication Data

US 2024/0255270 A1     Aug. 1, 2024

Related U.S. Application Data

(62) Division of application No. 16/800,229, filed on Feb. 25, 2020, now Pat. No. 11,604,058.

(51) Int. Cl.
| | |
|---|---|
| *G01B 7/30* | (2006.01) |
| *G01D 5/16* | (2006.01) |
| *G01D 5/244* | (2006.01) |
| *G01R 33/09* | (2006.01) |

(52) U.S. Cl.
CPC ................ *G01B 7/30* (2013.01); *G01D 5/16* (2013.01); *G01D 5/24471* (2013.01); *G01R 33/09* (2013.01)

(58) Field of Classification Search
CPC ........ G01B 7/30; G01D 5/16; G01D 5/24471; G01R 33/09
See application file for complete search history.

(56) References Cited

U.S. PATENT DOCUMENTS

| | | | |
|---|---|---|---|
| 6,131,457 A | 10/2000 | Sato | |
| 6,288,533 B1 | 9/2001 | Haeberli et al. | |
| 6,489,761 B1 | 12/2002 | Schroeder et al. | |
| 6,550,150 B1 | 4/2003 | Shirai et al. | |
| 6,580,269 B2 | 6/2003 | Hiligsmann et al. | |
| 7,768,083 B2 | 8/2010 | Doogue et al. | |
| 7,906,961 B2 * | 3/2011 | Abwa .................... | G01R 33/02 |
| | | | 324/249 |
| 7,932,718 B1 | 4/2011 | Wiegert | |
| 8,089,276 B2 | 1/2012 | Kentsch | |
| 8,575,929 B1 | 11/2013 | Wiegert | |
| 8,629,520 B2 | 1/2014 | Doogue et al. | |
| 8,952,471 B2 | 2/2015 | Doogue et al. | |
| 9,046,383 B2 | 6/2015 | Friedrich et al. | |

(Continued)

OTHER PUBLICATIONS

DE-102006057970-A1, Auburger (Year: 2008).*

(Continued)

*Primary Examiner* — Reena Aurora
(74) *Attorney, Agent, or Firm* — DALY, CROWLEY, MOFFORD & DURKEE, LLP

(57) ABSTRACT

In one aspect, an angle sensor includes a first linear sensor and a second linear sensor. A first magnetic-field direction of a target magnet measured by the first linear sensor is substantially equal to a second magnetic-field direction of the target magnet measured by the second linear sensor. The first linear sensor, the second linear sensor and the target magnet are on an axis. The angle sensor determines an angle of a magnetic field.

19 Claims, 15 Drawing Sheets

(56) References Cited

U.S. PATENT DOCUMENTS

| | | | | |
|---|---|---|---|---|
| 9,082,957 | B2 | 7/2015 | Doogue et al. | |
| 9,625,535 | B2 | 4/2017 | Cadugan et al. | |
| 9,797,746 | B2 | 10/2017 | Vuillermet et al. | |
| 9,852,832 | B2 | 12/2017 | Sirohiwala et al. | |
| 9,859,489 | B2 | 1/2018 | Doogue et al. | |
| 10,069,063 | B2 | 9/2018 | Doogue et al. | |
| 10,401,193 | B2 | 9/2019 | Mehnert et al. | |
| 10,533,877 | B2 * | 1/2020 | Zimmer | G01R 33/02 |
| 10,591,274 | B2 * | 3/2020 | Ausserlechner | G01B 7/003 |
| 10,670,669 | B2 | 6/2020 | Lassalle-Balier et al. | |
| 11,719,527 | B2 * | 8/2023 | Lassalle-Balier | G01B 7/30 |
| | | | | 324/207.13 |
| 2006/0038557 | A1 | 2/2006 | Johnson | |
| 2008/0184799 | A1 | 8/2008 | Phan Le et al. | |
| 2009/0267594 | A1 | 10/2009 | Kather | |
| 2011/0298447 | A1 | 12/2011 | Foletto et al. | |
| 2012/0012700 | A1 | 1/2012 | Eriksen et al. | |
| 2012/0086444 | A1 * | 4/2012 | Chen | H10D 48/40 |
| | | | | 324/251 |
| 2012/0274563 | A1 | 11/2012 | Olsson | |
| 2012/0280679 | A1 | 11/2012 | Shelton | |
| 2013/0147642 | A1 | 6/2013 | Rubio et al. | |
| 2013/0261990 | A1 | 10/2013 | Ura | |
| 2018/0259594 | A1 | 9/2018 | Fernandez et al. | |
| 2019/0235032 | A1 | 8/2019 | Lassalle-Balier | |
| 2019/0250222 | A1 | 8/2019 | Friedrich et al. | |
| 2019/0265018 | A1 | 8/2019 | Latham et al. | |
| 2019/0271568 | A1 | 9/2019 | Kozomora et al. | |
| 2019/0383646 | A1 | 12/2019 | Lassalle-Balier et al. | |
| 2020/0041310 | A1 | 2/2020 | Lassalle-Balier et al. | |
| 2020/0057097 | A1 | 2/2020 | Vuillermet et al. | |
| 2020/0088546 | A1 | 3/2020 | Sirohiwala et al. | |
| 2020/0116800 | A1 | 4/2020 | Lassalle-Balier et al. | |
| 2021/0262777 | A1 | 8/2021 | Lassalle-Balier et al. | |

OTHER PUBLICATIONS

U.S. Appl. No. 15/999,122, filed Aug. 17, 2018, Vuillermet et al.
U.S. Appl. No. 16/157,317, filed Oct. 11, 2018, Lassalle-Balier et al.
U.S. Appl. No. 16/244,452, filed Jan. 10, 2019, Lassalle-Balier et al.
U.S. Appl. No. 16/254,874, filed Jan. 23, 2019, Weiland et al.
U.S. Appl. No. 16/507,544, filed Jul. 10, 2019, David et al.
U.S. Appl. No. 16/507,552, filed Jul. 10, 2019, Lassallie-Balier et al.
U.S. Appl. No. 16/507,560, filed Jul. 10, 2019, Lassalle-Balier et al.
U.S. Appl. No. 16/683,800, filed Nov. 14, 2019, David et al.

U.S. 1$^{st}$ Non-Final Office Action dated Aug. 18, 2015 for U.S. Appl. No. 13/960,910; 22 Pages.
Response to U.S. 1$^{st}$ Non-Final Office Action dated Aug. 18, 2015 for U.S. Appl. No. 13/960,910; Response filed Nov. 11, 2015; 12 Pages.
U.S. 1$^{st}$ Final Office Action dated Jan. 7, 2016 for U.S. Appl. No. 13/960,910; 20 Pages.
Response to U.S. 1$^{st}$ Final Office Action dated Jan. 7, 2016 for U.S. Appl. No. 13/960,910; Response filed Apr. 4, 2016; 12 Pages.
U.S. 1$^{st}$ Advisory Action dated Apr. 20, 2016 for U.S. Appl. No. 13/960,910; 4 Pages.
Supplemental Response to U.S. 1$^{st}$ Final Office Action dated Jan. 7, 2016 for U.S. Appl. No. 13/960,910; Supplemental Response filed Jun. 7, 2016; 12 Pages.
U.S. 2$^{nd}$ Non-Final Office Action dated Jul. 1, 2016 for U.S. Appl. No. 13/960,910; 22 Pages.
Response to U.S. 2$^{nd}$ Non-Final Office Action dated Jul. 1, 2016 for U.S. Appl. No. 13/960,910; Response filed Sep. 9, 2016; 11 Pages.
U.S. 2$^{nd}$ Final Office Action dated Sep. 28, 2016 for U.S. Appl. No. 13/960,910; 27 Pages.
Response to U.S. 2$^{nd}$ Final Office Action dated Sep. 28, 2016 for U.S. Appl. No. 13/960,910; Response filed Dec. 28, 2016; 11 Pages.
U.S. 2$^{nd}$ Advisory Action dated Jan. 9, 2017 for U.S. Appl. No. 13/960,910; 4 Pages.
Supplemental Response to U.S. 2$^{nd}$ Final Office Action dated Sep. 28, 2016 for U.S. Appl. No. 13/960,910; Supplemental Response filed Jan. 20, 2017; 11 Pages.
U.S. Notice of Allowance dated Jan. 30, 2017 for U.S. Appl. No. 13/960,910; 12 Pages.
U.S. Restriction Requirement dated Mar. 21, 2022 for U.S. Appl. No. 16/800,229; 7 Pages.
Response to U.S. Restriction Requirement dated Mar. 21, 2022 for U.S. Appl. No. 16/800,229; Response filed Apr. 1, 2022; 1 Page.
U.S. Non-Final Office Action dated Jun. 2, 2022 for U.S. Appl. No. 16/800,229; 16 Pages.
Response to U.S. Non-Final Office Action dated Jun. 2, 2022 for U.S. Appl. No. 16/800,229; Response filed Jun. 9, 2022; 13 Pages.
U.S. Final Office Action dated Sep. 15, 2022 for U.S. Appl. No. 16/800,229; 27 Pages.
Response to U.S. Final Office Action dated Sep. 15, 2022 for U.S. Appl. No. 16/800,229; Response filed Dec. 14, 2022; 17 Pages.
U.S. Notice of Allowance dated Jan. 23, 2023 for U.S. Appl. No. 16/800,229; 11 Pages.
Rule 312 Amendment filed Jan. 30, 2023 for U.S. Appl. No. 16/800,229; 13 Pages.

* cited by examiner magnet target
10

First 2D linear sensor

Second 2D linear sensor

Wire bonding
44

First 2D linear sensor
14

Spacer
28

Die 1  32

Die 2  36

34

Solder balls

PCB  42

18
Second 2D linear sensor

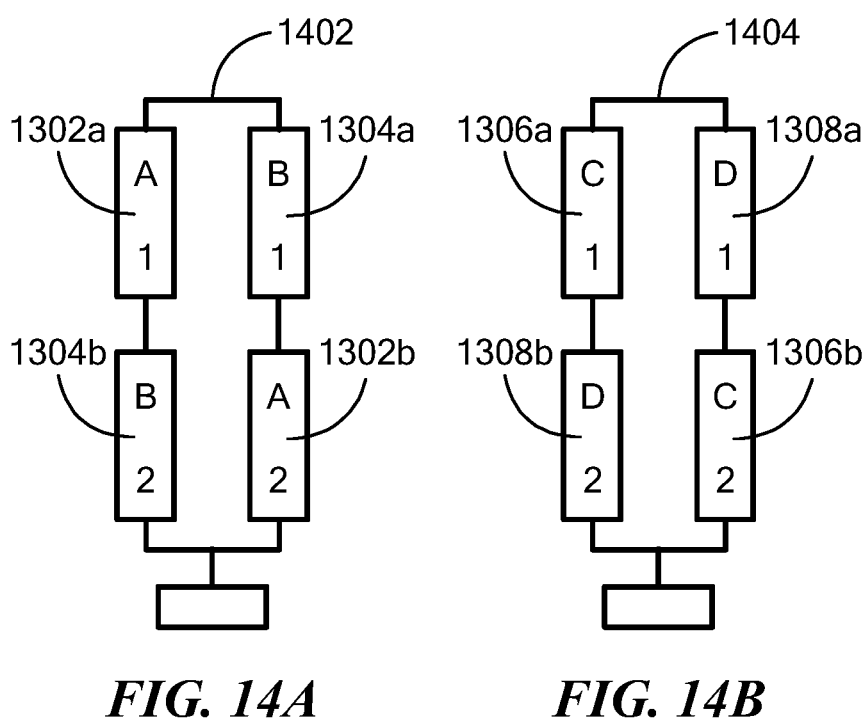
FIG. 14A          FIG. 14B
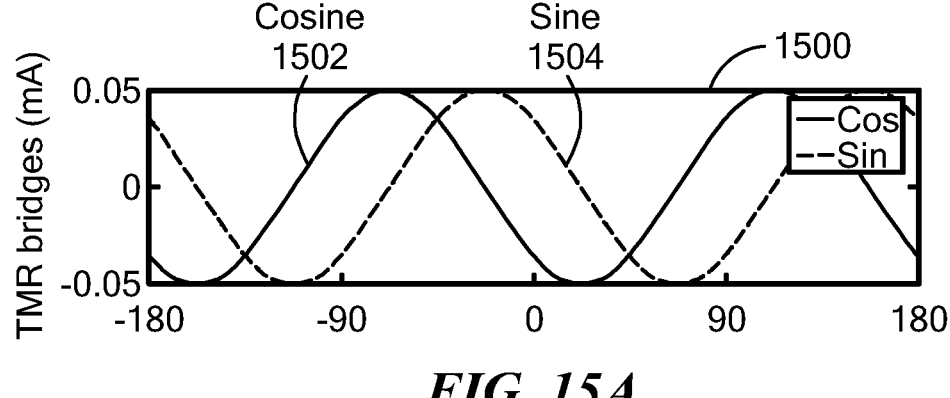
FIG. 15A
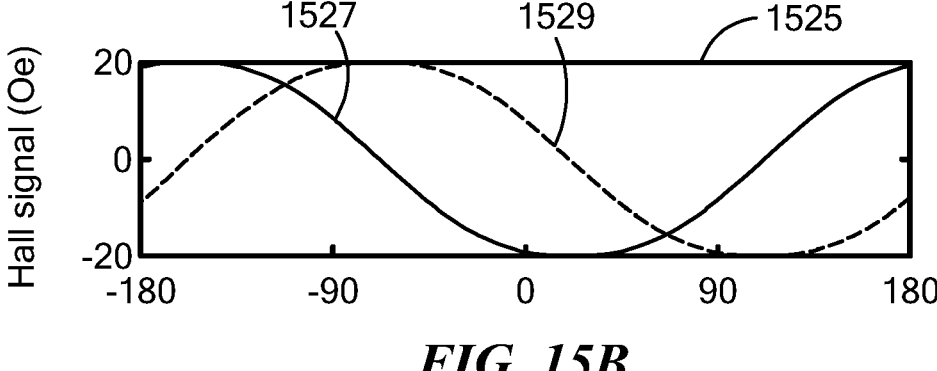
FIG. 15B

REDUCING STRAY MAGNETIC FIELD EFFECT ON AN ANGLE SENSOR

CROSS REFERENCE TO RELATED APPLICATIONS

This is a Divisional application and claims the benefit of and priority to U.S. patent application Ser. No. 16/800,229, filed Feb. 25, 2020, entitled "REDUCING STRAY MAGNETIC FIELD EFFECT ON AN ANGLE SENSOR," which is incorporated herein by reference in its entirety.

BACKGROUND

Typically, a magnetic-field angle sensor measures a direction of a magnetic-field vector through 360° in an x-y plane. In one example, a magnetic-field angle sensor may be used to detect an angular position of a rotating magnet. The presence of stray magnetic fields (i.e., magnetic fields coming from other sources than a desired target) can increase an angle error of the angle sensor. Generally, the angle error is defined to be the difference between an actual position of a magnet and a position of the magnet as measured by the angle sensor.

SUMMARY

In one aspect, an angle sensor includes a first linear sensor and a second linear sensor. A first magnetic-field direction of a target magnet measured by the first linear sensor is substantially equal to a second magnetic-field direction of the target magnet measured by the second linear sensor. The first linear sensor, the second linear sensor and the target magnet are on an axis. The angle sensor determines an angle of a magnetic field.

In another aspect, an angle sensor configuration includes a first coil, a second coil parallel to the first coil and an angle sensor disposed between the first coil and the second coil. The angle sensor configured to determine an angle of a magnetic field.

In a further aspect, an angle sensor configuration includes an angle sensor, a first magnet having a first outward magnetized pole along a first axis away from the angle sensor and a second magnet opposite the first magnetic. The second magnet has a second outward magnetized pole along the first axis away from the angle sensor. The angle sensor configuration further includes a third magnet having a first inward magnetized pole along a second axis toward the angle sensor and a fourth magnet opposite the third magnetic. The third magnet has a second inward magnetized pole along the second axis toward the angle sensor. The angle sensor is disposed between the first, second, third and fourth magnets. The angle sensor configured to determine an angle of a magnetic field.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIG. 14A is a diagram of an example of a cosine bridge at locations in FIG. 13;

FIG. 14B is a diagram of an example of a sine bridge at locations in FIG. 13;

FIG. 15A is a graph of example of outputs for the sine and cosine bridges of FIGS. 14A and 14B;

FIG. 15B is a graph of example of Hall signals;

DETAIL DESCRIPTION

Described herein are techniques to reduce a stray magnetic field (sometimes referred to as a "stray field") effect on an angle sensor. A reduced stray magnetic field effect contributes to reducing angle errors in the angle sensor.

As used herein, the term "magnetic-field sensing element" is used to describe a variety of electronic elements that can sense a magnetic field. The magnetic-field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic-field sensing elements tend to have an axis of maximum sensitivity parallel to a substrate that supports the magnetic-field sensing element, and others of the above-described magnetic-field sensing elements tend to have an axis of maximum sensitivity perpendicular to a substrate that supports the magnetic-field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Figure 1:
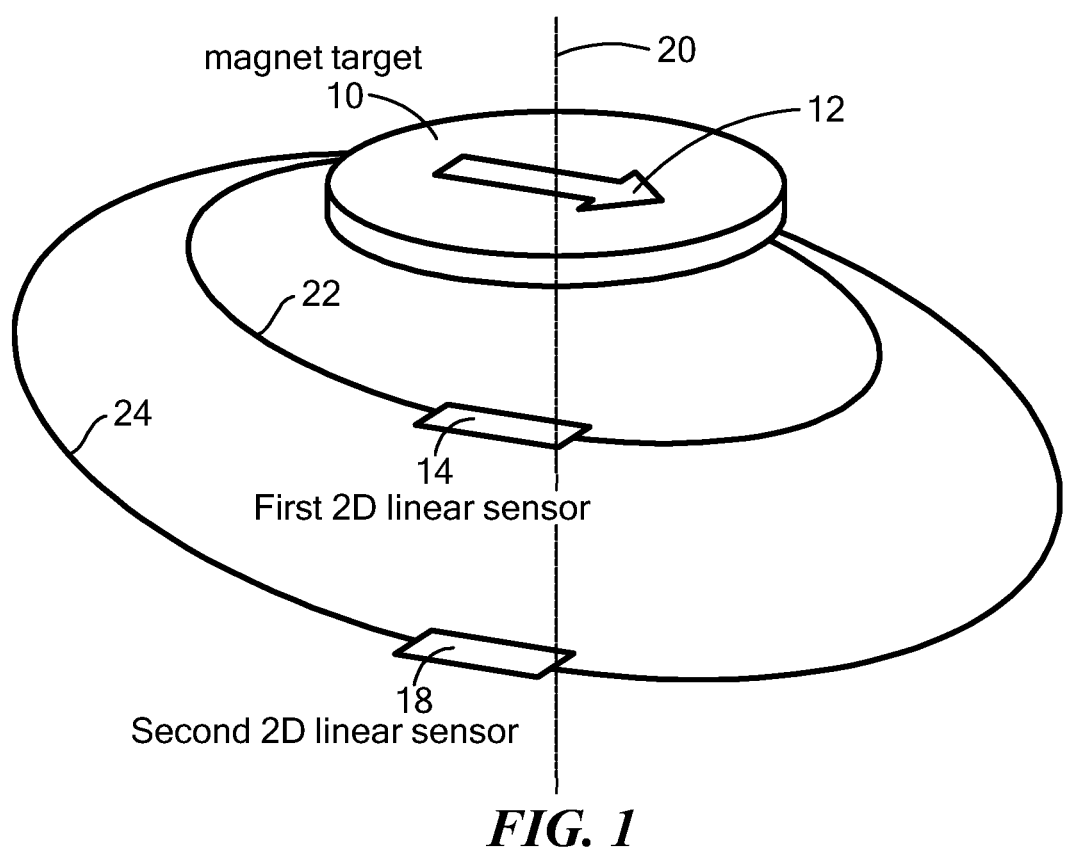
FIG. 1 is a diagram of an example of stacked two-dimensional (2D) linear sensors forming an angle sensor to reduce a stray magnetic field effect.

Referring to FIG. 1, in one example, two-dimensional (2D) linear sensors may be used together to function like an angle sensor. For example, a first two-dimensional (2D) linear sensor 14 and a second 2D linear sensor 18 are vertically aligned on an axis 20 with a magnet target 10. An arrow 12 indicates an in-plane magnetization of the magnet target 10. In one example, the first 2D linear sensor 14 is disposed along a first plane (not shown) and the second linear sensor is disposed along a second plane (not shown) and the first plane and the second plane are each perpendicular to the axis 20.

An ellipse 22 represents a high-field magnetic flux line and an ellipse 24 represents a low-field magnetic flux line. Thus, the first 2D linear sensor 14 experiences a higher magnetic field amplitude than the second 2D linear sensor 18. The magnetic field amplitude decreases when distance increases.

In one embodiment, the 2D linear sensors 14, 18 have a linear range equal to the maximum field range from the target plus twice a maximum amplitude of a stray magnetic field, which allows the 2D linear sensors 14, 18 avoid saturation.

The stacked 2D linear sensors 14, 18 allow for the detection of the amplitude and direction of the magnetic field generated by magnetic target 10 at two locations where the magnetic field direction is identical at both locations, but the magnetic field amplitude varies. As will be further described herein, the useful signal is the amplitude difference of the detected magnetic fields from these two locations.

Figure 2:
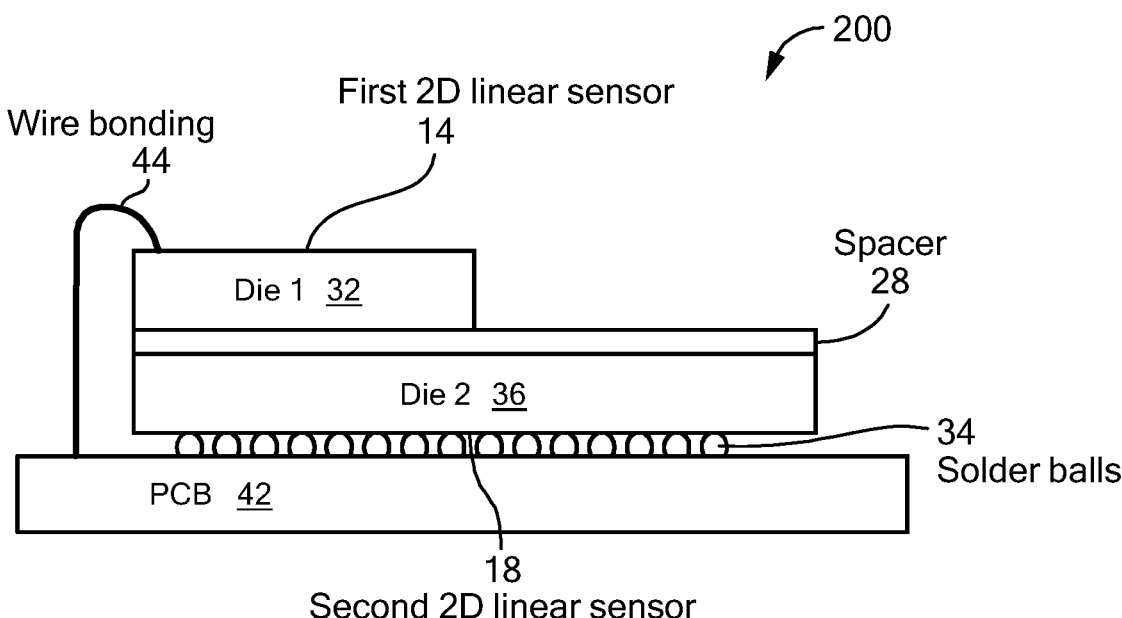
FIG. 2 is a diagram of example of stacked 2D linear sensor package configuration.

Referring to FIG. 2, an example of a configuration to package the first and second 2D linear sensors 14, 18 is a package 200. The package 200 includes a first die 32 having the first 2D linear sensor 14 on a top surface, a second die 36 having the second 2D linear sensor on a bottom surface and a printed circuit board (PCB) 42.

A spacer 28 separates (e.g., by about 25 microns) the first die 32 from the second die 36. In one example the second die 36 may be a flip-chip structure that is connected to the PCB 42 using solder balls 34. In one embodiment, a bonding wire 44 connects the PCB 42 to the first 2D linear sensor 14. In one example, the first linear sensor 14 and the second linear sensor 18 are spaced apart by about 1 millimeter. In other embodiments, multiple bonding wires (not shown) connect the PCB 42 to the first 2D linear sensor 14.

The package 200 is an example of placing the 2D linear sensors 14, 18 as far apart from each other as possible in the same package. System optimization may include optimizing the signal assuming the air gap constraints, the sensor linear range, and the maximum distance between the two sensors imposed by the packaging constraints.

In one example, each of the 2D linear sensors 14, 18 includes a magnetic-field sensing element. In one example, the magnetic-field sensing element is a magnetoresistance element (e.g., TMR or GMR). An advantage of this configuration is that the sensor integration in the system does not differ from a standard angle sensor integration (i.e., a fixed sensor mounted in front of a rotating magnet).

Figure 3:
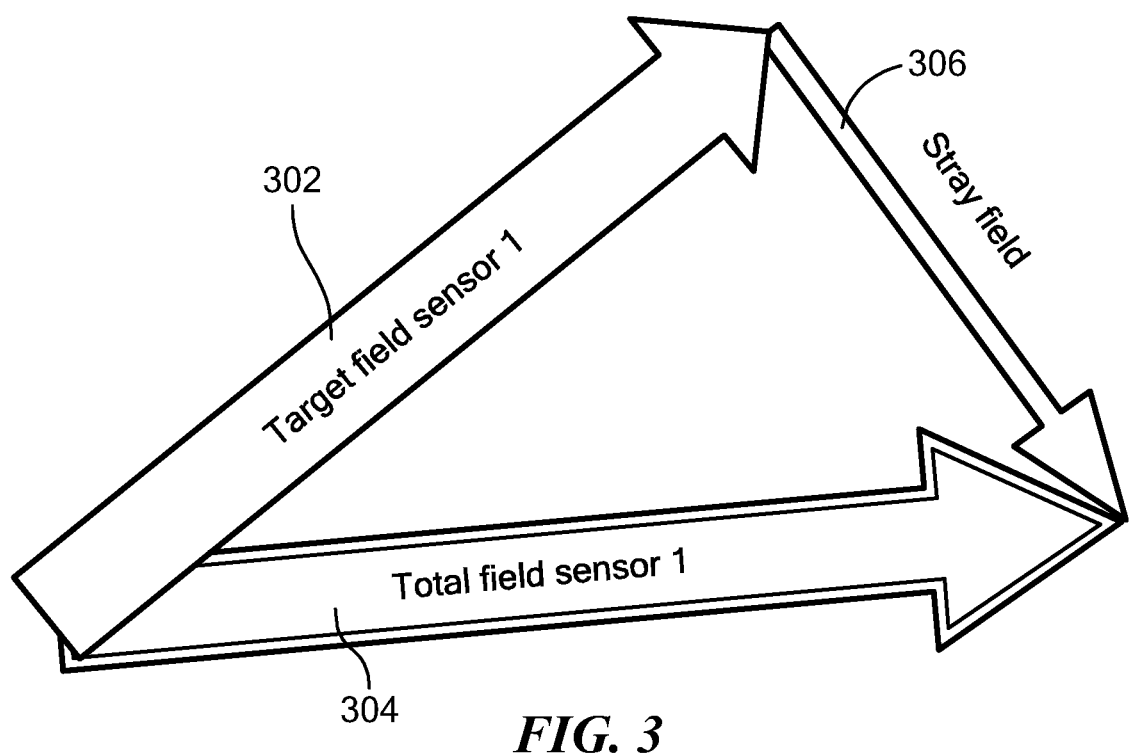
FIG. 3 is a diagram of an example of magnetic field directions for one of the stacked 2D linear sensors closer to the magnet target.

FIG. 3 depicts fields sensed by the first 2D linear sensor 14. An arrow 302 indicates a target magnetic field from the magnetic target 10 and an arrow 306 represents a stray magnetic field. An arrow 304 represents the total field (i.e., the target magnetic field arrow 302 plus the stray field arrow 306).

Figure 4:
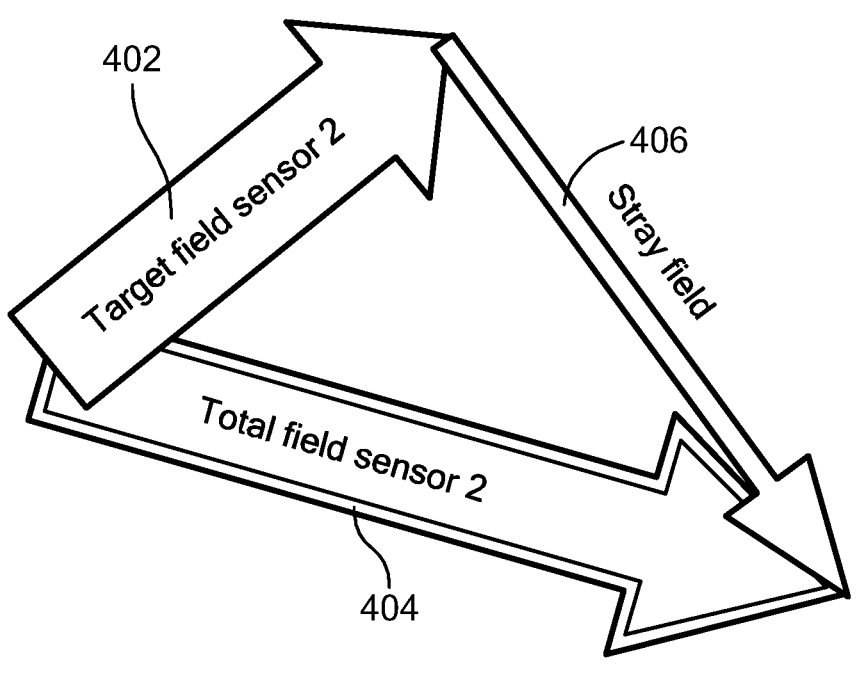
FIG. 4 is a diagram of an example of magnetic field directions for one of the stacked 2D linear sensors further to the magnet target.

FIG. 4 depicts fields sensed by the second 2D linear sensor 18. An arrow 402 indicates a target magnetic field from the magnetic target 10 and an arrow 406 represents the stray magnetic field. An arrow 404 represents the total field (i.e., the target magnetic field arrow 402 plus the stray magnetic field arrow 406). FIGS. 3 and 4 are not drawn to the same scale. That is, arrow 306 and arrow 406 should be the same size since the magnetic stray field is in a common mode (i.e., the same in all space of the application).

Figure 5:
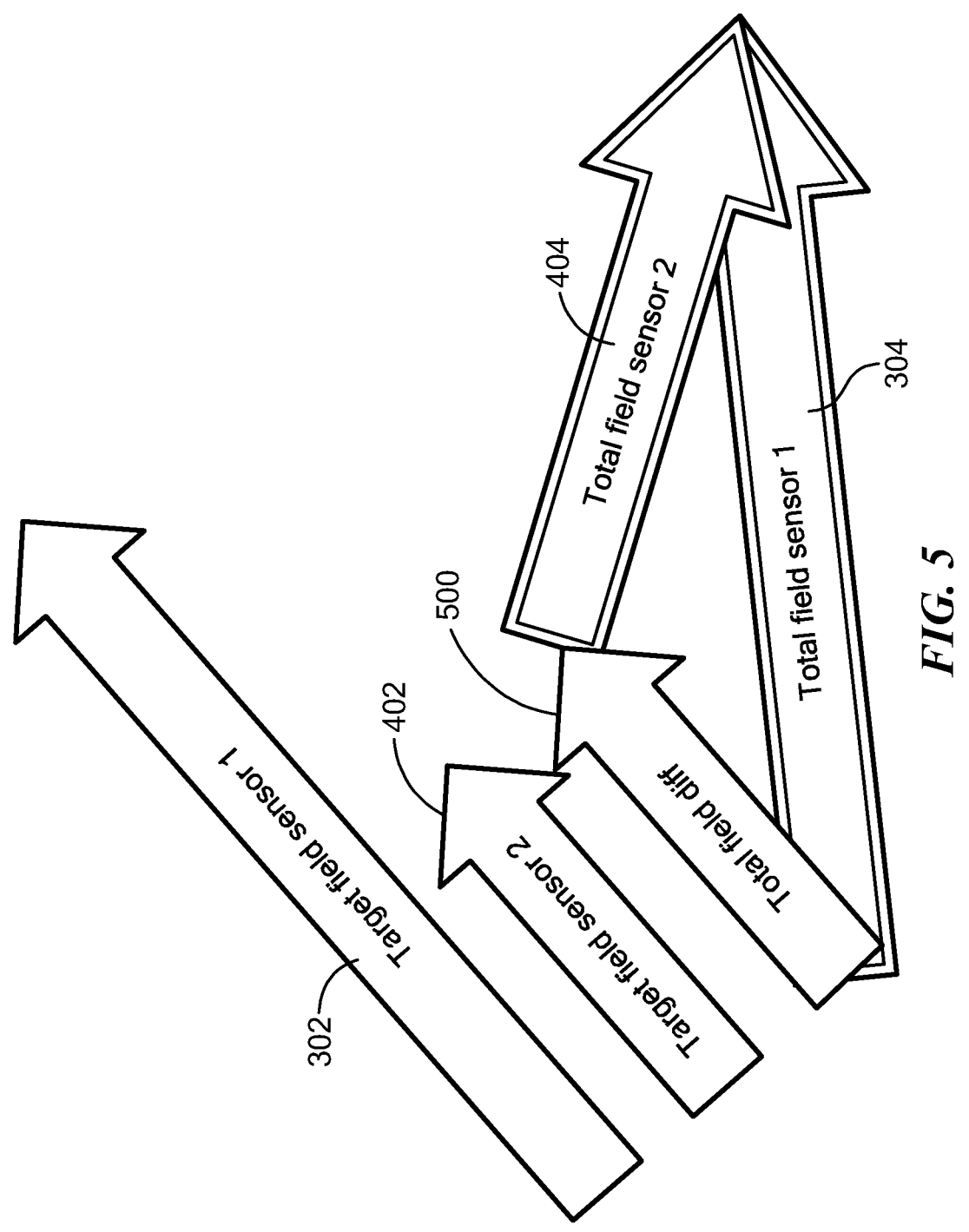
FIG. 5 is a diagram of an example of magnetic field directions for the 2D stacked linear sensors.

FIG. 5 depicts magnetic fields experienced by the first 2D linear sensor 14 and the second 2D linear sensor 18. The arrows 302, 402 are parallel to each other and the difference of the target magnetic fields (i.e., difference of the arrows 302, 402) is depicted by an arrow 500 parallel to the arrows 302, 402. The total magnetic field arrows 304, 404 at the first 2D linear sensor 14 and the second 2D linear sensor 18 respectively are not parallel to the target magnetic fields 302, 402 because of the stray magnetic field. However, as the stray magnetic field is identical at both 2D linear sensors 14, 18, when the total magnetic fields are subtracted, the result is a difference parallel to the target magnetic fields 302, 302. Therefore, using two 2D linear sensors together provides a way to sense a standard magnet target while still reducing the effects of stray magnetic fields.

Figure 6:
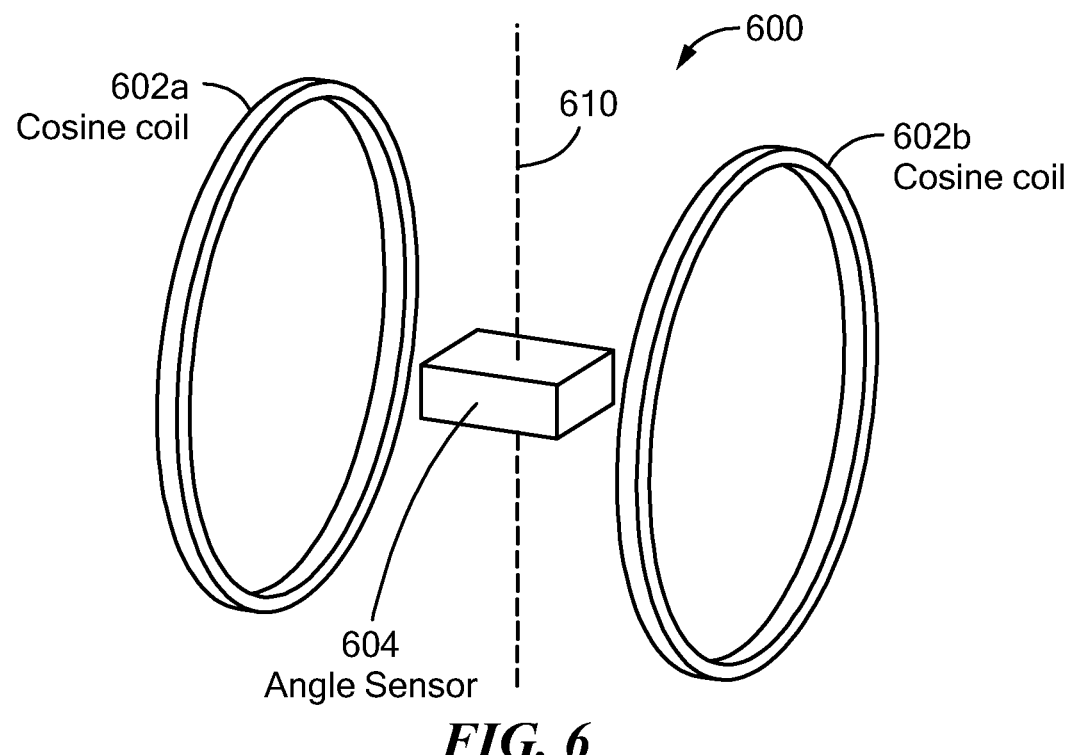
FIG. 6 is a diagram of an example of an angle sensor configuration with two cosine coils to reduce a stray magnetic field effect.

Referring to FIG. 6, another example of a configuration to reduce stray magnetic field effects is a configuration 600. The configuration 600 includes an angle sensor 604 between a cosine coil 602a and a cosine coil 602b. In this configuration, detection of a magnetic field occurs at higher frequencies where there are no stray magnetic fields. The magnetic field is modulated using the cosine coils 600a, 600b as an emitter and the angle of the magnetic field is detected. The coils 602a, 602b are attached to a rotating device (not shown) that rotates about the axis 610. In one embodiment, the coils 602a, 602b rotate about the axis at a frequency below 100 KHz.

Figure 7:
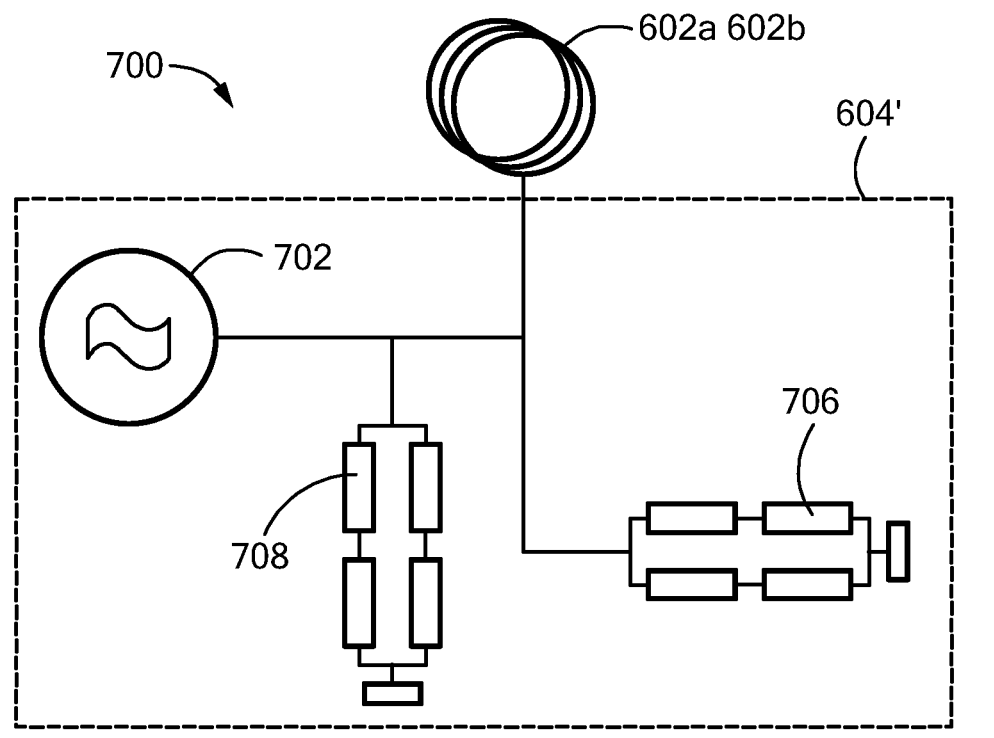
FIG. 7 is a diagram of an example of a circuit representation of FIG. 6 having two bridges.

Referring to FIG. 7, a circuit representation of the configuration 600 (FIG. 6) is a circuit 700. The circuit includes the coils 602a, 602b and an angle sensor 604', which is an example of the angle sensor 604 (FIG. 6). The angle sensor 604' includes a modulator 702 that modulates the coils 602a, 602b at a modulation frequency.

The angle sensor 604' also includes a cosine bridge 706 and a sine bridge 708 that are modulated by the modulator 702 by the modulation frequency. The cosine bridge 706 and the sine bridge 708 are perpendicular to one another and have a reference (sensitive) axis perpendicular to one another. That is, the cosine bridge 706 is most sensitive along an x-axis and the sine bridge 708 is most sensitive along the y-axis.

The cosine bridge 706 and the sine bridge 708 demodulate the magnetic field signal generated by the cosine coils 602a, 602b. By demodulating the outputs of the two bridges the x-axis and y-axis projections of the detected magnetic field are obtained, i.e. the cosine and the sine of the measured magnetic field angle (multiplied by the field amplitude).

Figure 8A:
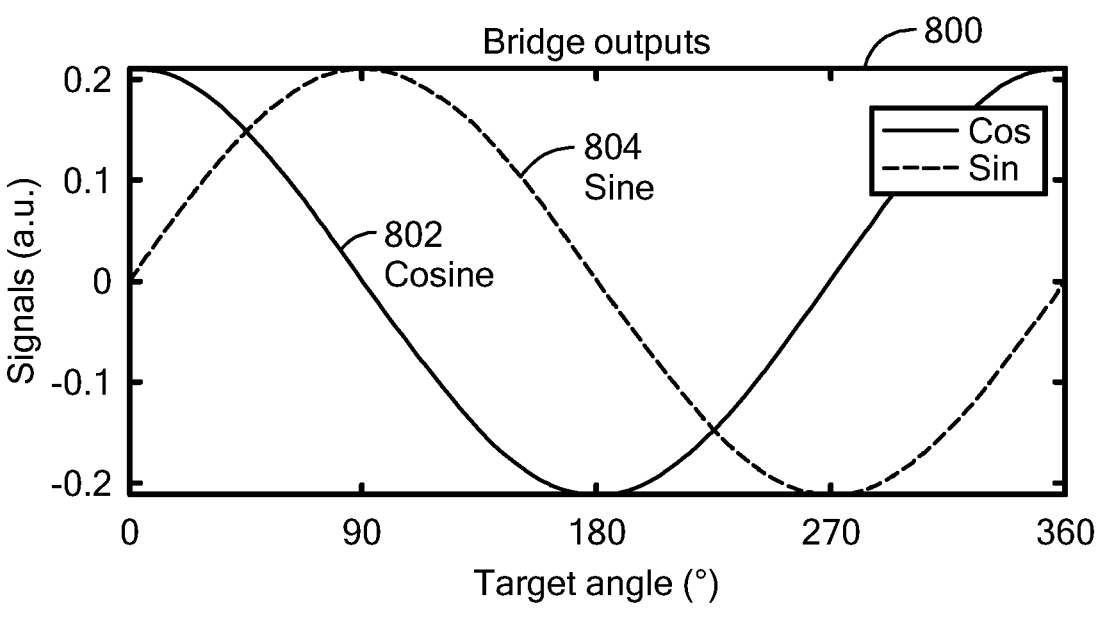
FIG. 8A is a graph of an example of outputs of the two bridges in FIG. 7.
Figure 8B:
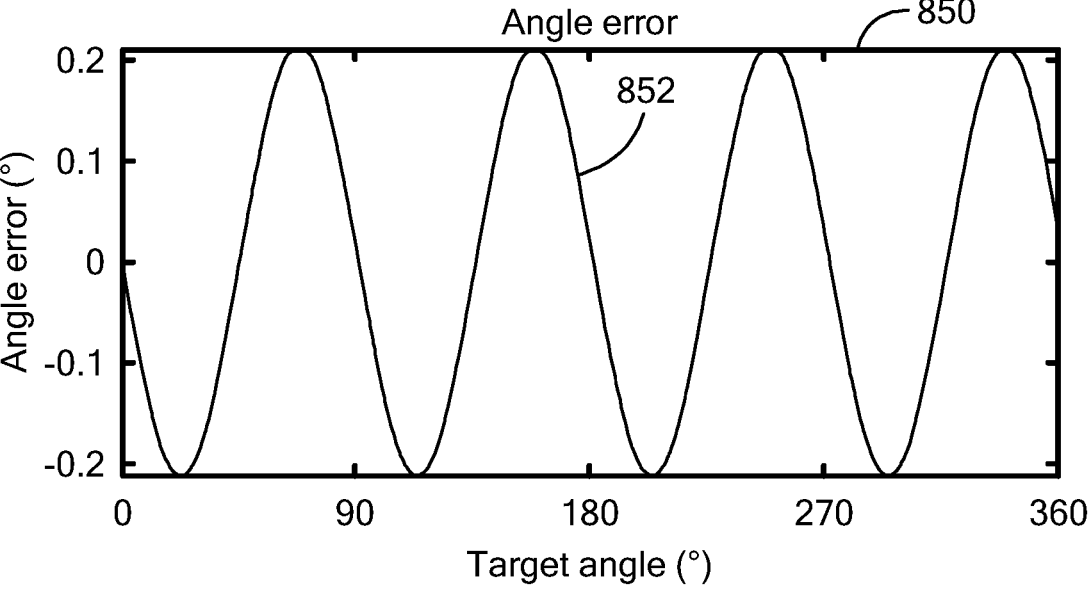
FIG. 8B is a graph of an example of the angle error for the angle sensor configuration of FIG. 6.

Referring to FIG. 8A, an example of an output of the cosine bridge 706 is depicted by the curve 802 and an example of an output of the sine bridge 708 is depicted by the curve 804. In this example, the cosine bridge 706 and the cosine bridge 708 include GMRs. FIG. 8B shows a curve of the angle error versus detected angle of magnetic field.

Figure 9:
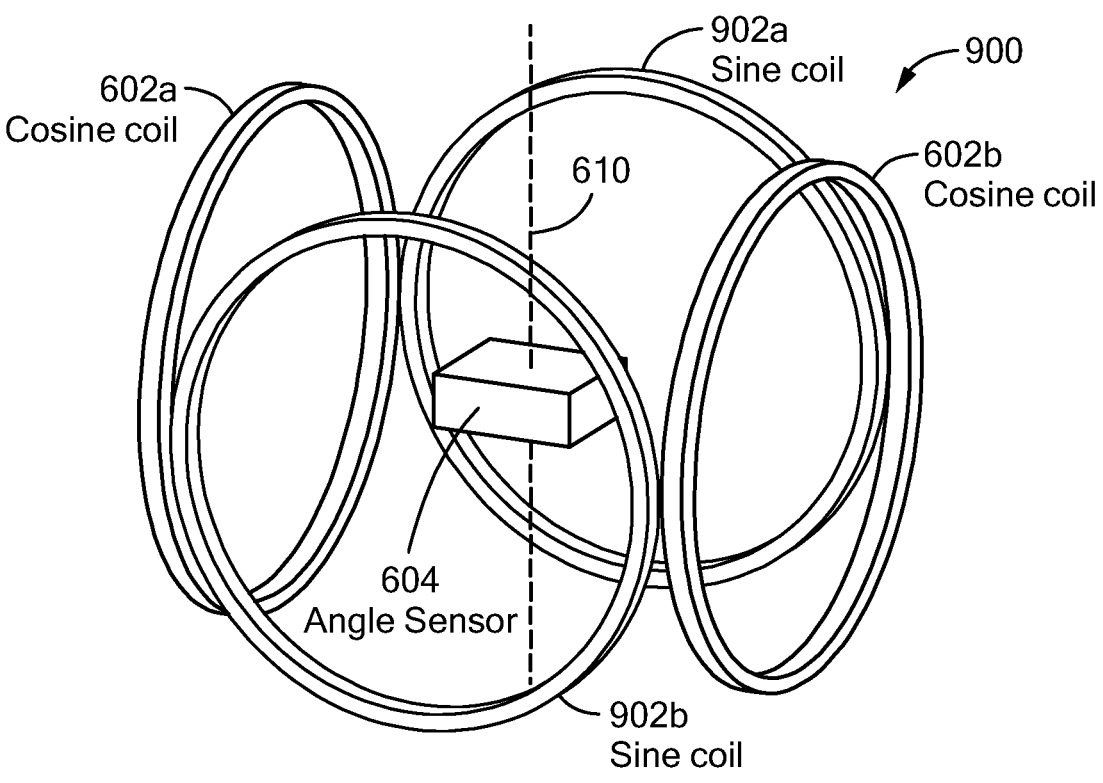
FIG. 9 is a diagram of another example of an angle sensor configuration with two cosine and two sine coils to reduce a stray magnetic field effect.

Referring to FIG. 9, another example of a configuration to reduce a stray magnetic field effect is a configuration 900. The configuration 900 is similar to the configuration 600 except the configuration 900 includes a sine coil 902a and a sine coil 902b. The sine coils 902a, 902b are perpendicular to the cosine coils 602a, 602b. The emitter 702 modulates the sine coils 902a, 902b at a modulation frequency. The sine coils 902a, 902b are also attached to the rotating device that rotates about the axis 610.

In one example, the coils 602a, 602b, 902a, 902b may be activated by time and/or frequency multiplex. In one example, the coils 602a, 602b, 902a, 902b may be modulated at the same time or the cosine coils 602a, 602b may be modulated at first time and the sine coils 902a, 902b may be modulated at a second time different from the first time. In one example, the cosine coils 602a, 602b may be modulated at the same modulation frequency, or the cosine coils 602a, 602b may be modulated at a first modulation frequency and the sine coils 902a, 902b may be modulated at a second modulation frequency different from the first modulation frequency. In one example, the cosine coils 602a, 602b may be modulated at the first time at the first modulation frequency and the sine coils 902a, 902b may modulated at the second time at the second frequency modulation.

Figure 10:
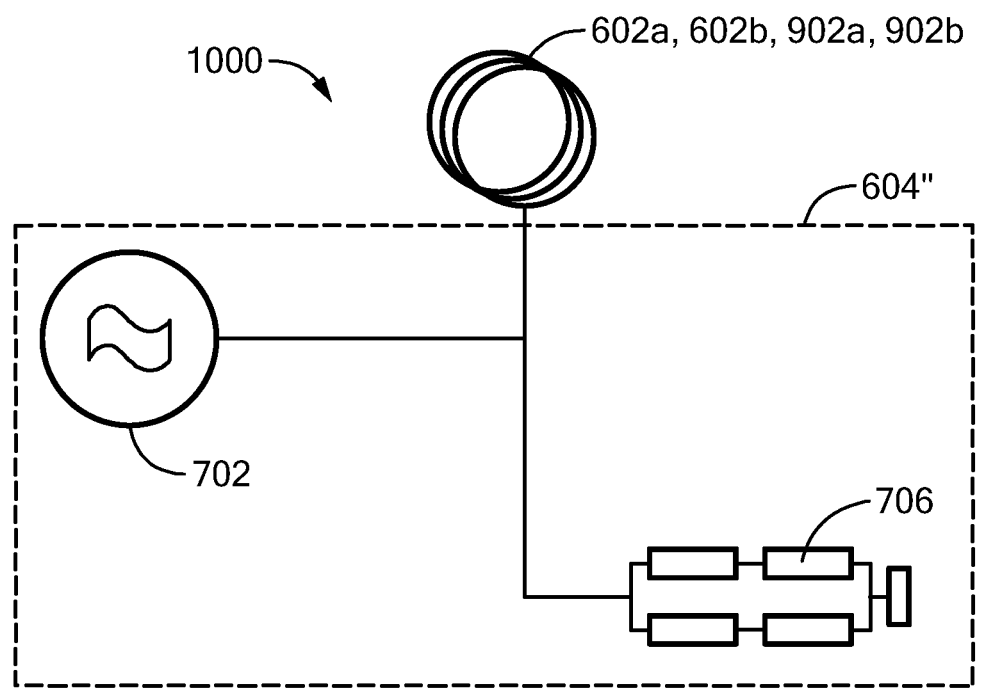
FIG. 10 is a circuit representation of FIG. 9 having one bridge.

Referring to FIG. 10, a circuit representation of the configuration 900 (FIG. 9) is a circuit 1000. The circuit 1000 is similar to the circuit 700 except the circuit 1000 includes an angle sensor 604" but does not include the sine bridge 708.

Figure 11:
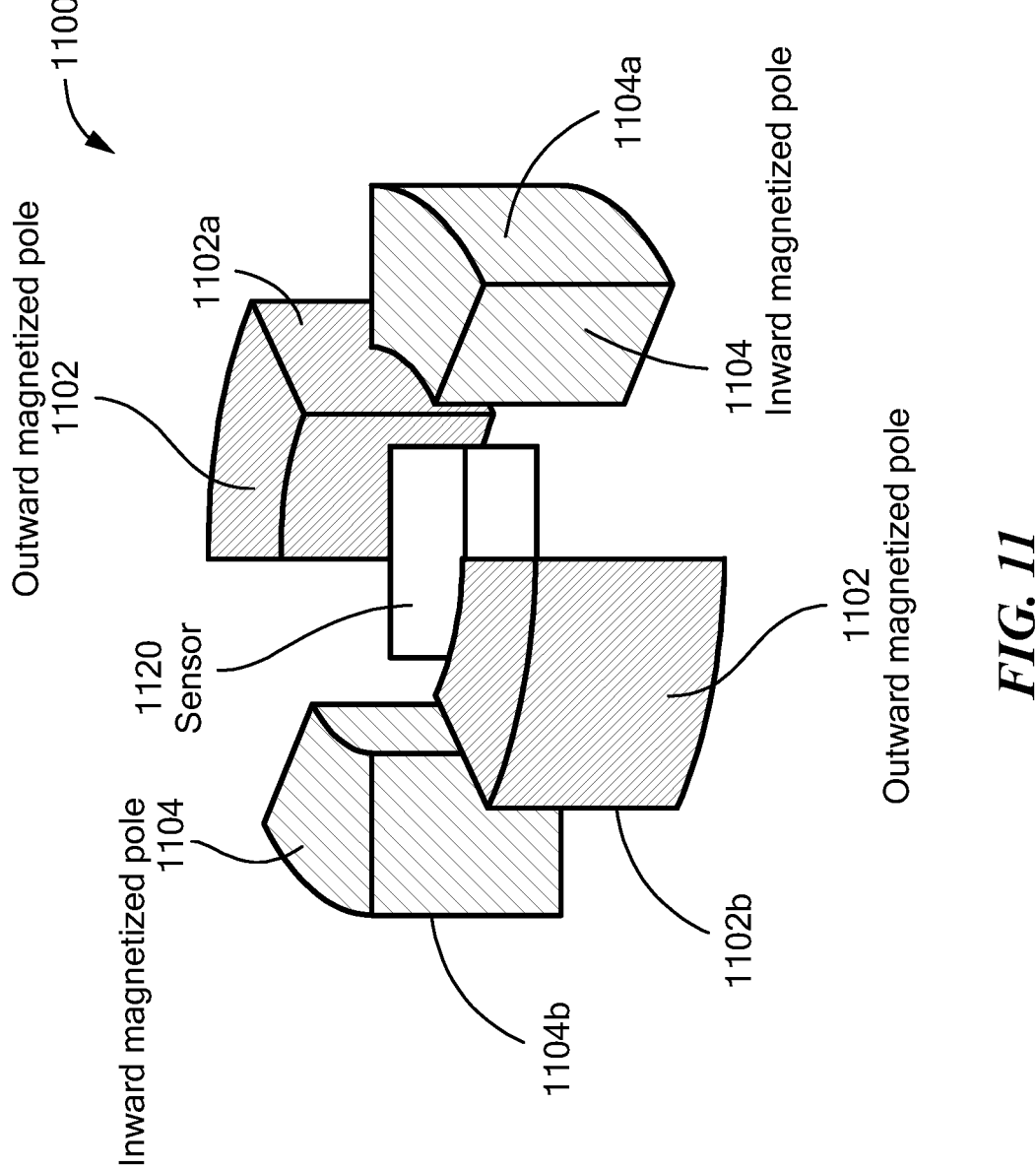
FIG. 11 is a diagram of an example of an angle sensor configuration with inward and outward magnetized pole magnets to reduce a stray magnetic field effect.

Referring to FIG. 11, a further example of a configuration to reduce a stray magnetic field effect is a configuration 1100. The configuration 1100 includes an angle sensor 1120 with outward magnetized pole magnets 1102 (e.g., an outward magnetized pole magnet 1102a and an outward magnetized pole magnet 1102b) and inward magnetized pole magnets 1104 (e.g., an inward magnetized pole magnet 1104a and an inward magnetized pole magnet 1104b). The angle sensor 1120 is located at the center of the magnet target (i.e., the center between the magnetized pole magnets 1102a, 1102b, 1104a, 1104b).

The outward magnetized pole magnet 1102a is positioned opposite the outward magnetized pole magnet 1102b, and the angle sensor 1120 is positioned between the outward magnetized pole magnets 1102a, 1102b. Magnetization of each of the outward magnetized pole magnet 1102a, 1102b points away from the angle sensor 1120.

The inward magnetized pole magnet 1104a is positioned opposite the inward magnetized pole magnet 1104b, and the angle sensor 1120 is positioned between the inward magnetized pole magnets 1104a, 1104b. Magnetization of each of the inward magnetized pole magnet 1104a, 1104b points towards the angle sensor 1120.

In one example, the angle sensor 1120 includes TMR elements. In another example, the angle sensor 1120 includes GMR elements. In a further example, the angle sensor 1120 includes magnetometers. In further examples, TMR elements, GMR elements or magnetometers may be in one or more bridges included with the angle sensor 1120.

Figures 12, 13:
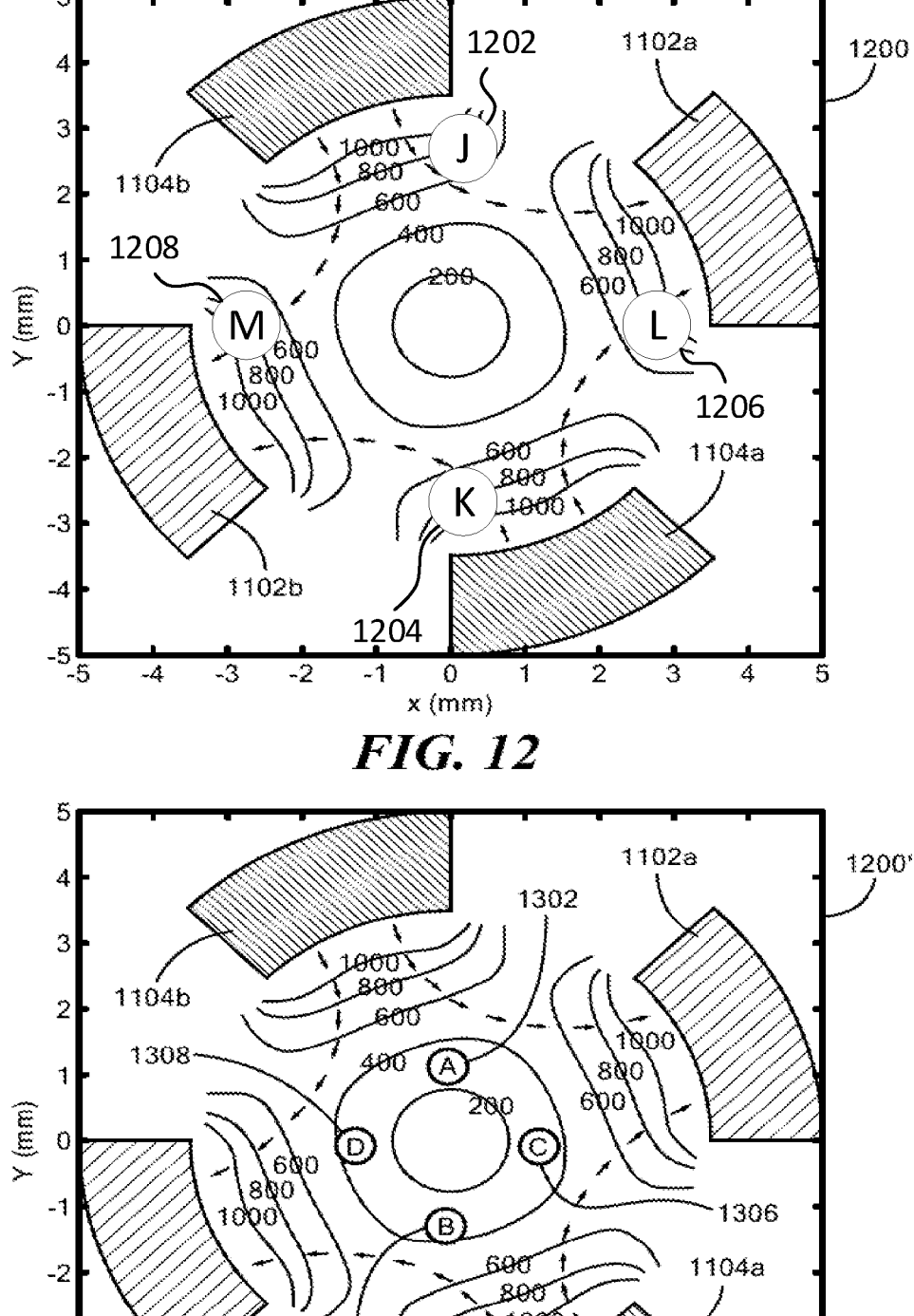
FIG. 12 is a diagram of the inward and outward magnetized pole magnets of FIG. 11 overlaid with an example of a level plot of magnetic field amplitudes.
FIG. 13 is a diagram of FIG. 12 with example locations for magnetoresistance elements.

FIG. 12 depicts a diagram 1200 inward and outward magnetized pole magnets 1102a, 1102b, 1104a, 1104b overlaid with a quiver plot and overlaid with a level plot of magnetic field amplitudes. In one embodiment, there is an out of plane component of the magnetic field. For example, the magnetized poles 1102b, 1104b have a magnetization tilted 15° out of the page while the magnetized poles 1102a, 1104a have a magnetization tiled 15° into the page. Hall plates may be located at locations J 1202, K 1204, L 1206 and M 1208 that can measure the out of plane component of the magnetic field.

FIG. 13 depicts a diagram 1200' which is the same as FIG. 12, except the diagram designates locations where magnetoresistance elements may be placed to reduce the effects of a stray magnetic field. In this embodiment there are four locations: a location A 1302, a location B 1304 opposite location A 1302, a location C 1306 and a location D 1308 opposite the location C 1308. In this embodiment, two magnetoresistance elements may be placed at each location 1302, 1304, 1306, 1308 and locations 1302, 1304, 1306, 1308 are equally spaced a part around a circle (not shown) so that a line (not shown) from location A to location B is perpendicular to and bisects a line (not shown) from C to D.

Referring to FIGS. 14A and 14B, the angle sensor 1120 (FIG. 11) may include bridges such as a cosine bridge 1402 and a sine bridge 1404. In FIG. 14A the cosine bridge 1402 includes a magnetoresistance element 1302a and a magnetoresistance element 1304b in series with each other and in parallel with a magnetoresistance element 1304a and a magnetoresistance element 1302b. The magnetoresistance element 1302a and the magnetoresistance element 1302b are located at the location A 1302 (FIG. 13), and the magnetoresistance element 1304a and the magnetoresistance element 1304b are located at the location B 1304 (FIG. 13).

In FIG. 14B the sine bridge 1404 includes a magnetoresistance element 1306a and a magnetoresistance element 1308b in series with each other and in parallel with a magnetoresistance element 1308a and a magnetoresistance element 1306*b*. The magnetoresistance element 1306*a* and the magnetoresistance element 1306*b* are located at the location C 1306 (FIG. 13), and the magnetoresistance element 1308*a* and the magnetoresistance element 1308*b* are located at the location D 1308 (FIG. 13).

Referring to FIG. 15A, an example of an output of the cosine bridge 1402 is depicted by the curve 1502 and an example of an output of the sine bridge 1404 is depicted by the curve 1504. Referring to FIG. 15B, a curve 1527 represents a Hall plate signal that takes the difference between location J 1202 and location K 1204 and a curve 1529 represents a Hall plate signal that takes the difference between location L 1206 and location K 1208.

Figure 15C:
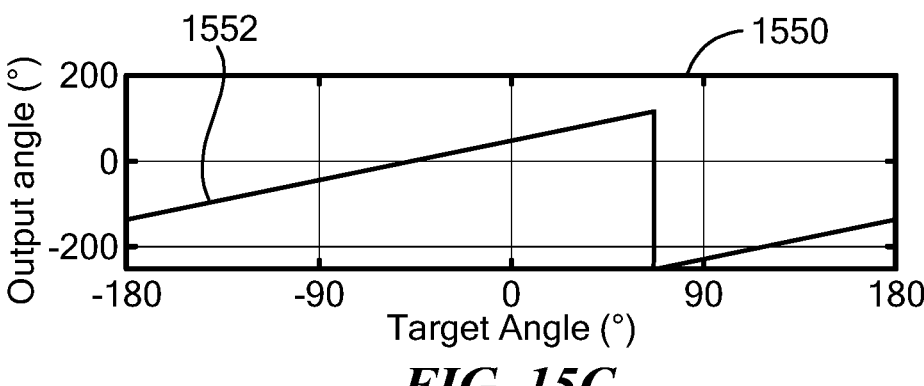
FIG. 15C is a graph of an example of an output signal of an angle sensor.
Figure 15D:
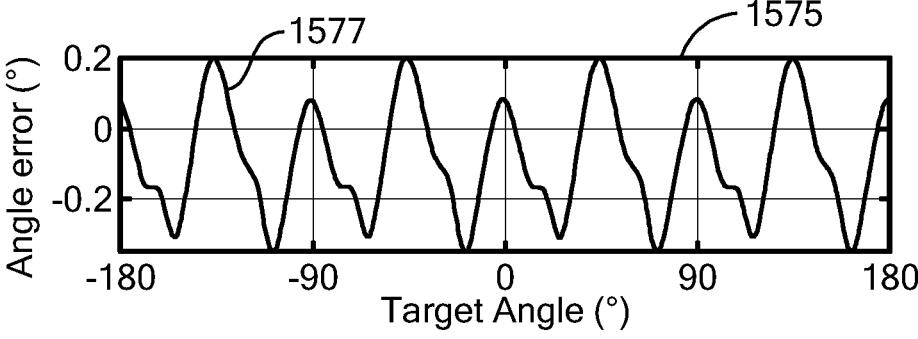
FIG. 15D is a graph of an example of an angle error for the angle sensor configuration of FIG. 11.

Referring to FIG. 15C, a graph 1550 includes a curve 1552 depicting the output angle of the angle sensor 1120. The curve 1150 is derived using the curves 1502, 1504, 1527, 1529. For example, since the cosine curve 1502 and the sine curve 1504 have two periods between −180° and 180°, the curves 1527 and 1529 are used to determine if the target angle is between 0° and 180° or between 180° and 360°. Referring to FIG. 15D, a graph 1575 includes a curve 1577 depicting the angle error and is derived from the curve 1552.

Figure 16:
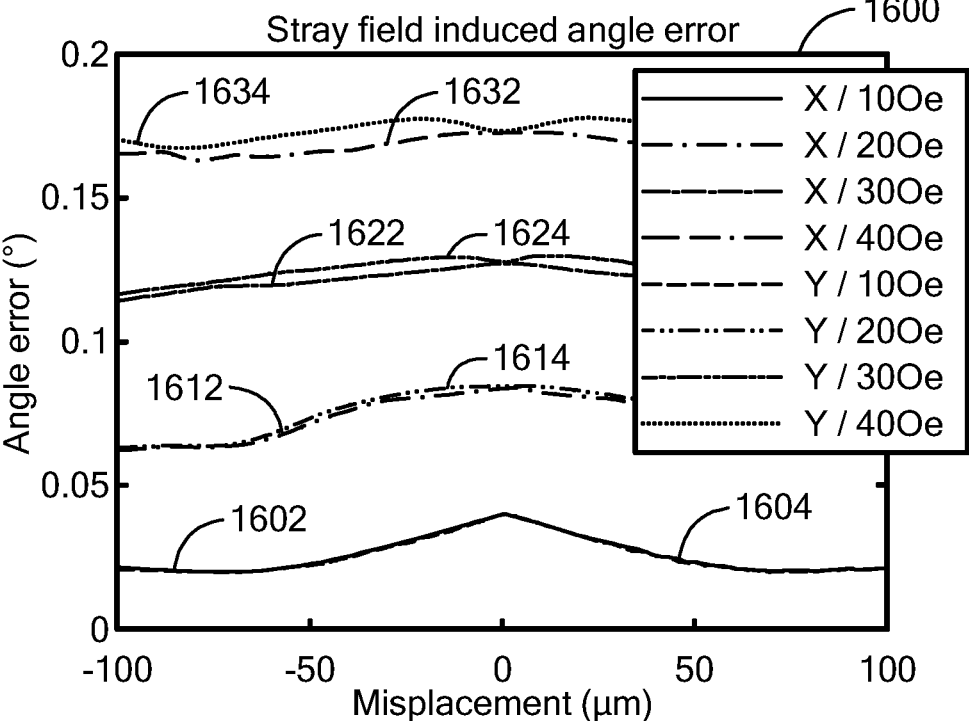
FIG. 16 is a graph of an example of stray magnetic field induced angle error for the configuration in FIG. 11.

Referring to FIG. 16, a graph 1600 depicts worse angle error due to different stray magnetic field amplitudes for different misplacements of the angle sensor from the center of the target. Worst angle error means a worst case between all combinations of target phase and stray field phase. The stray magnetic field induced error is lower than the accuracy before any corrections for misplacement of the sensor from the center of the magnet target (i.e., the center between the magnetized pole magnets 1102*a*, 1102*b*, 1104*a*, 1104*b*.

For example, a curve 1602 represents the maximum angle error due to a rotating 10 Oersted (Oe) stray field versus misplacement in the X-direction and a curve 1604 represents the maximum angle error due to a rotating 10 Oe stray field versus misplacement in the Y-direction, a curve 1612 represents the maximum angle error due to a rotating 20 Oe stray field versus misplacement in the X-direction and a curve 1614 represents the maximum angle error due to a rotating 20 Oe stray field versus misplacement in the Y-direction, a curve 1622 represents the maximum angle error due to a rotating 30 Oe stray field versus misplacement in the X-direction and a curve 1624 represents the maximum angle error due to a rotating 30 Oe stray field versus misplacement in the Y-direction, and a curve 1632 represents the maximum angle error due to a rotating 40 Oe stray field versus misplacement in the X-direction and a curve 1634 represents the maximum angle error due to a rotating 40 Oe stray field versus misplacement in the Y-direction.

Figure 17:
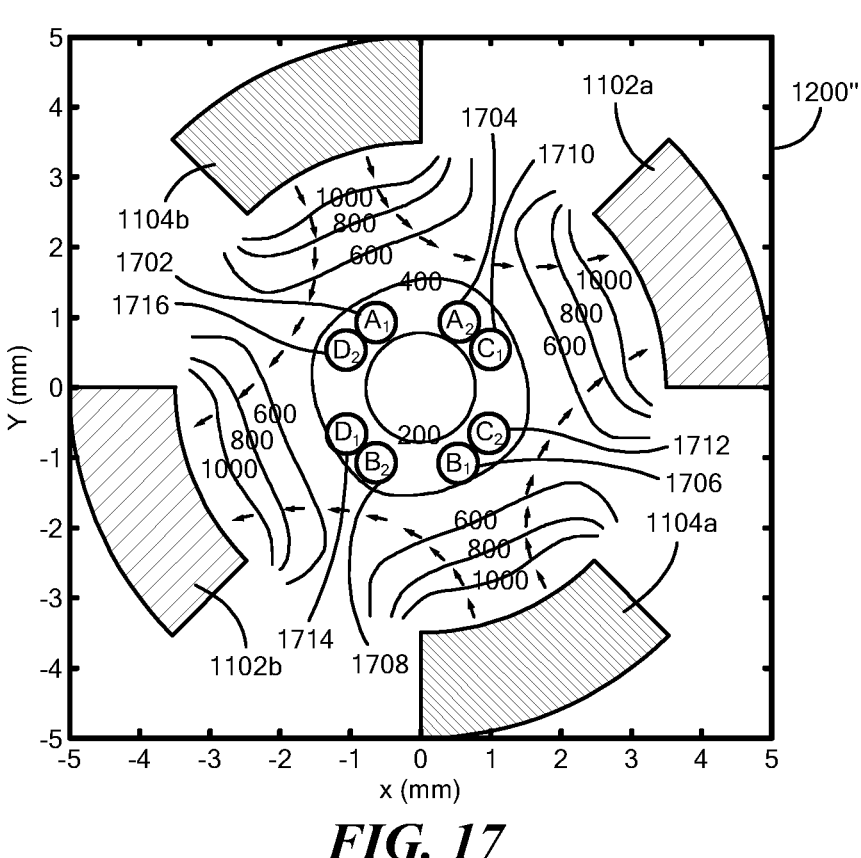
FIG. 17 is a diagram of FIG. 13 with additional examples locations for magnetoresistance elements.

Referring to FIG. 17, depicts a diagram 1200″ which is the same as FIG. 13, except the diagram designates additional locations where magnetoresistance elements of an angle sensor may be placed to reduce the effects of a stray magnetic field. In this embodiment there are eight locations: a location $A_1$ 1702, a location $A_2$ 1704, a location $B_1$ 1706, a location $B_2$ 1708, a location $C_1$ 1710, a location $C_2$ 1712, a location $D_1$ 1714 and a location $D_2$ 1716. In this embodiment, two magnetoresistance elements may be placed at each location 1702-1716.

Figure 18A:
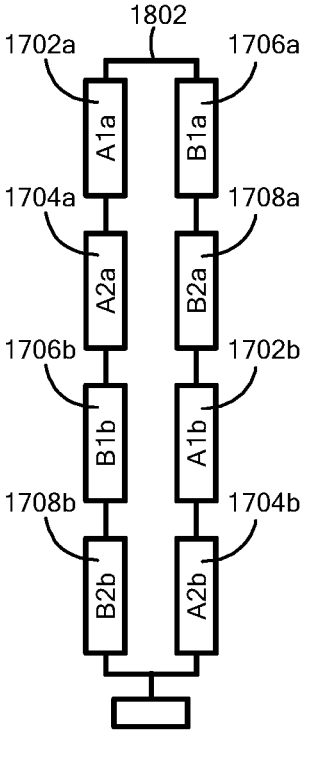
FIG. 18A is a diagram of an example of a cosine bridge at locations in FIG. 17.
Figure 18B:
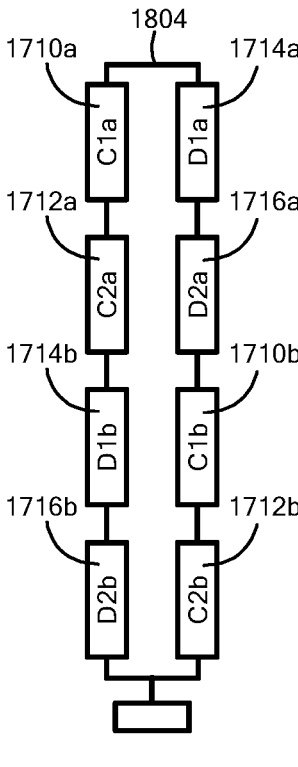
FIG. 18B is a diagram of an example of a sine bridge at locations in FIG. 17.

Referring to FIGS. 18A and 18B, the angle sensor 1120 (FIG. 11) may include bridges such as a cosine bridge 1802 and a sine bridge 1804. In FIG. 18A the cosine bridge 1802 includes a magnetoresistance element 1702*a*, a magnetoresistance element 1704*a*, a magnetoresistance element 1706*b*, and a magnetoresistance element 1708*b* in series with each other and in parallel a magnetoresistance element

1702*b*, a magnetoresistance element 1704*b*, a magnetoresistance element 1706*a*, and a magnetoresistance element 1708*a*.

The magnetoresistance element 1702*a* and the magnetoresistance element 1702*b* are located at the location $A_1$ 1702 (FIG. 17), and the magnetoresistance element 1704*a* and the magnetoresistance element 1704*b* are located at the location $A_2$ 1704 (FIG. 17). The magnetoresistance element 1706*a* and the magnetoresistance element 1706*b* are located at the location $B_1$ 1706 (FIG. 17), and the magnetoresistance element 1708*a* and the magnetoresistance element 1708*b* are located at the location $B_2$ 1708 (FIG. 17).

In FIG. 18B the sine bridge 1804 includes a magnetoresistance element 1710*a*, a magnetoresistance element 1712*a*, a magnetoresistance element 1714*b*, and a magnetoresistance element 1716*b* in series with each other and in a magnetoresistance element 1710*b*, a magnetoresistance element 1712*b*, a magnetoresistance element 1714*a*, and a magnetoresistance element 1716*a*.

The magnetoresistance element 1710*a* and the magnetoresistance element 1710*b* are located at the location $C_1$ 1710 (FIG. 17), and the magnetoresistance element 1712*a* and the magnetoresistance element 1712*b* are located at the location $C_2$ 1712 (FIG. 17). The magnetoresistance element 1714*a* and the magnetoresistance element 1714*b* are located at the location $D_1$ 1714 (FIG. 17), and the magnetoresistance element 1716*a* and the magnetoresistance element 1716*b* are located at the location $D_2$ 1716 (FIG. 17).

Figure 19:
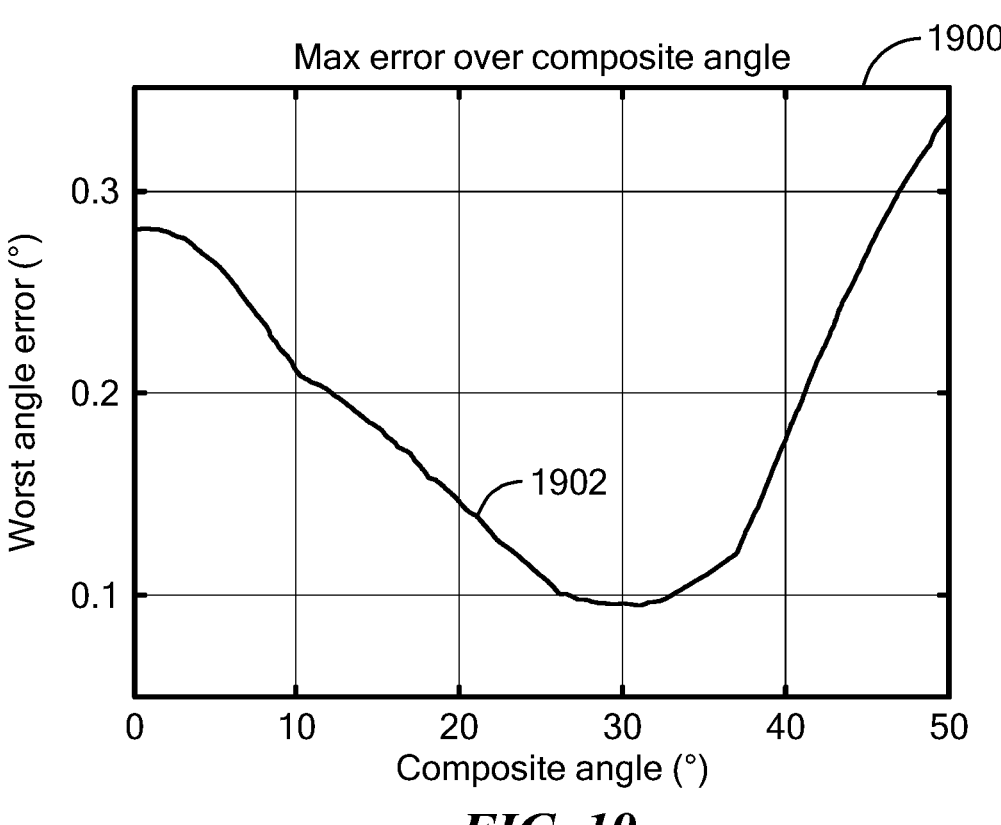
FIG. 19 is a graph of an example of maximum error over a composite angle.

Referring to FIG. 19, a graph 1900 includes a curve 1902. The curve 1902 indicates a maximum angular error over a full rotation versus a composite angle. The composite angle is half the angle of a split of: the MR elements 1702*a*, 1702*b*, 1704*a*, 1704*b* at location $A_1$ 1702 and $A_2$ 1704; or the MR elements 1706*a*, 1706*b*, 1708*a*, 1708*b* at location $B_1$ 1706 and location $B_2$ 1708; or the MR elements 1710*a*, 1710*b*, 1712*a*, 1712*b* at location $C_1$ 1710 and location $C_2$ 1712; or the MR elements 1714*a*, 1714*b*, 1716*a*, 1716*b* at location $D_1$ 1714 and location $D_2$ 1716. Thus, in this example, choosing a composite angle of about 30° is at least three times better than choosing a composite angle of 50°.

Figure 20:
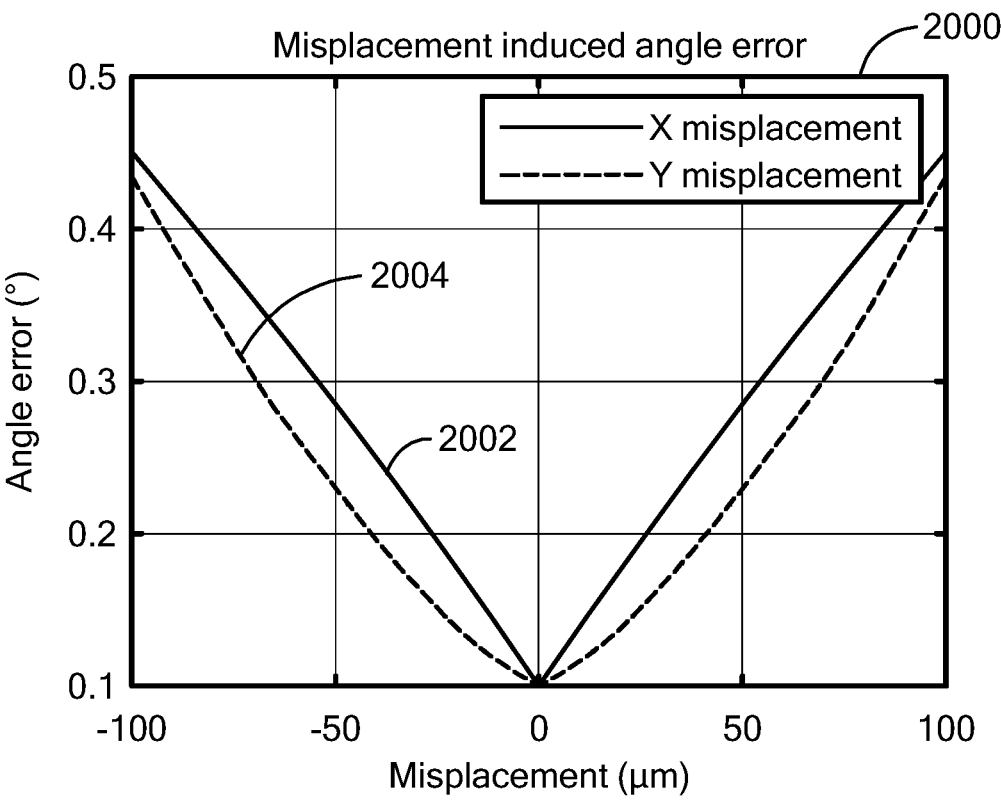
FIG. 20 is a graph of an example of misplacement induced angle error.

Referring to FIG. 20, a graph 2000 includes curves 2002, 2004. The curve 2002 shows the maximum angle error over a full rotation versus X-axis misplacement of the angle sensor. The curve 2004 shows the maximum angle error over a full rotation versus Y-axis misplacement of the angle sensor.

Figure 21:
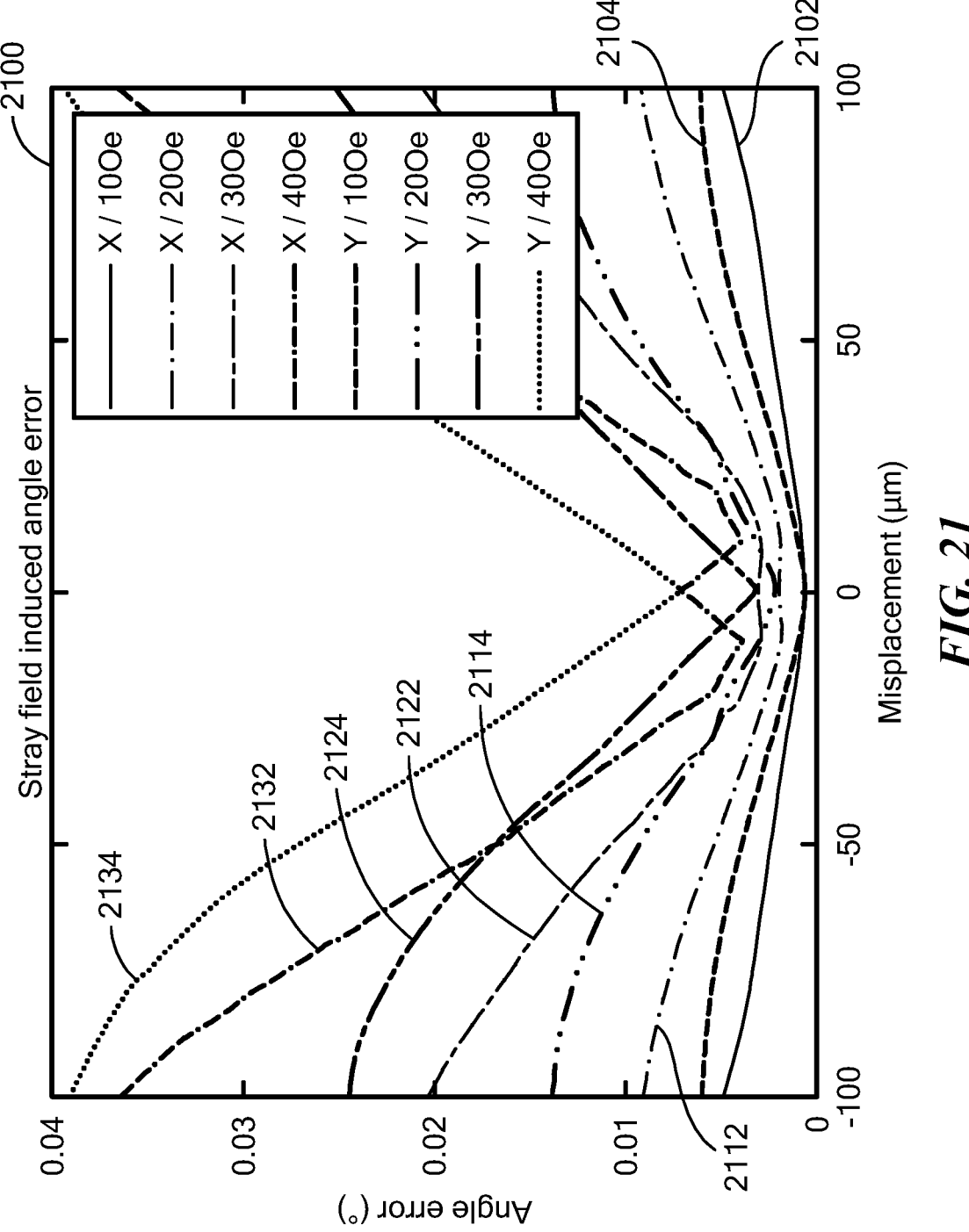
FIG. 21 is a graph of an example of stray magnetic field induced angle error for the configuration in FIG. 17.

Referring to FIG. 21, a graph 2100 depicts worse angle error due to different stray field amplitudes for different misplacements of the angle sensor from the center of the target. When compared to FIG. 20, the stray magnetic field induced error is lower than the accuracy before any corrections for misplacement of the sensor from the center of the magnet target (i.e., the center between the magnetized pole magnets 1102*a*, 1102*b*, 1104*a*, 1104*b*.

For example, a curve 2102 represents the maximum angle error due to a rotating 10 Oe stray field versus misplacement in the X-direction and a curve 2104 represents the maximum angle error due to a rotating 10 Oe stray field versus misplacement in the Y-direction, a curve 2112 represents the maximum angle error due to a rotating 20 Oe stray field versus misplacement in the X-direction and a curve 2114 represents the maximum angle error due to a rotating 20 Oe stray field versus misplacement in the Y-direction, a curve 2122 represents the maximum angle error due to a rotating 30 Oe stray field versus misplacement in the X-direction and a curve 2124 represents the maximum angle error due to a rotating 30 Oe stray field versus misplacement in the Y-direction, and a curve 2132 represents the maximum angle error due to a rotating 40 Oe stray field versus misplacement in the X-direction and a curve 2134 represents the maximum angle error due to a rotating 40 Oe stray field versus misplacement in the Y-direction at.

Figure 22:
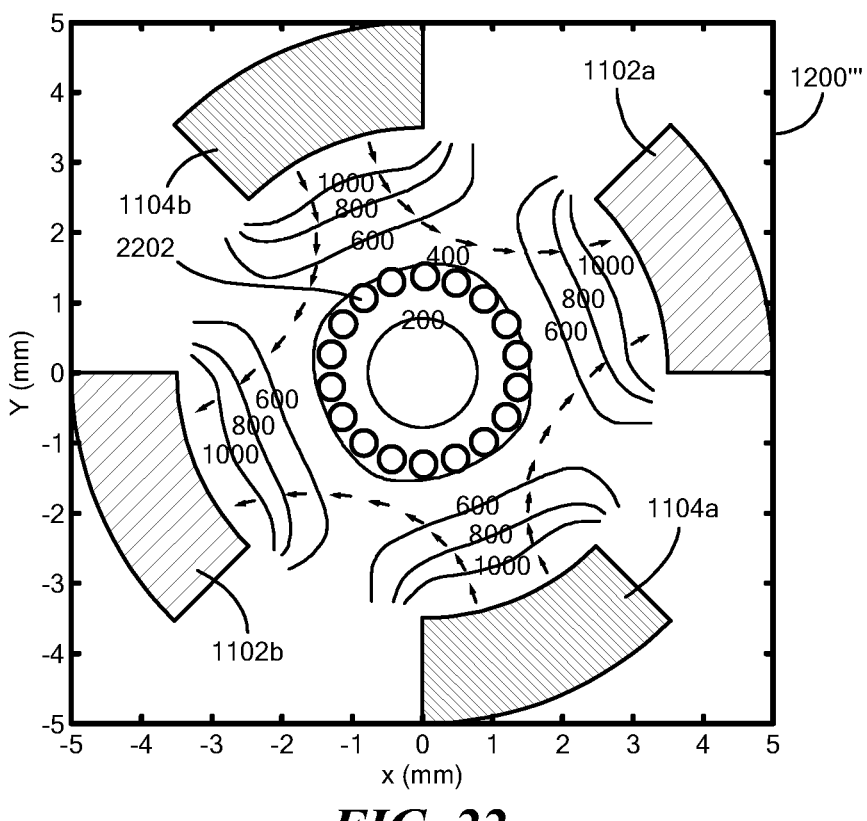
FIG. 22 is a diagram of FIG. 17 with additional examples locations for magnetoresistance elements arranged in a circle.

FIG. 22 depicts a diagram 1200''' which is the same as FIG. 17, except the diagram designates additional locations where magnetoresistance elements of an angle sensor may be placed to reduce the effects of a stray magnetic field. In this embodiment there are eighteen locations (e.g., a location 2202) arranged in a circle wherein magnetoresistance elements may be placed.

Figure 23:
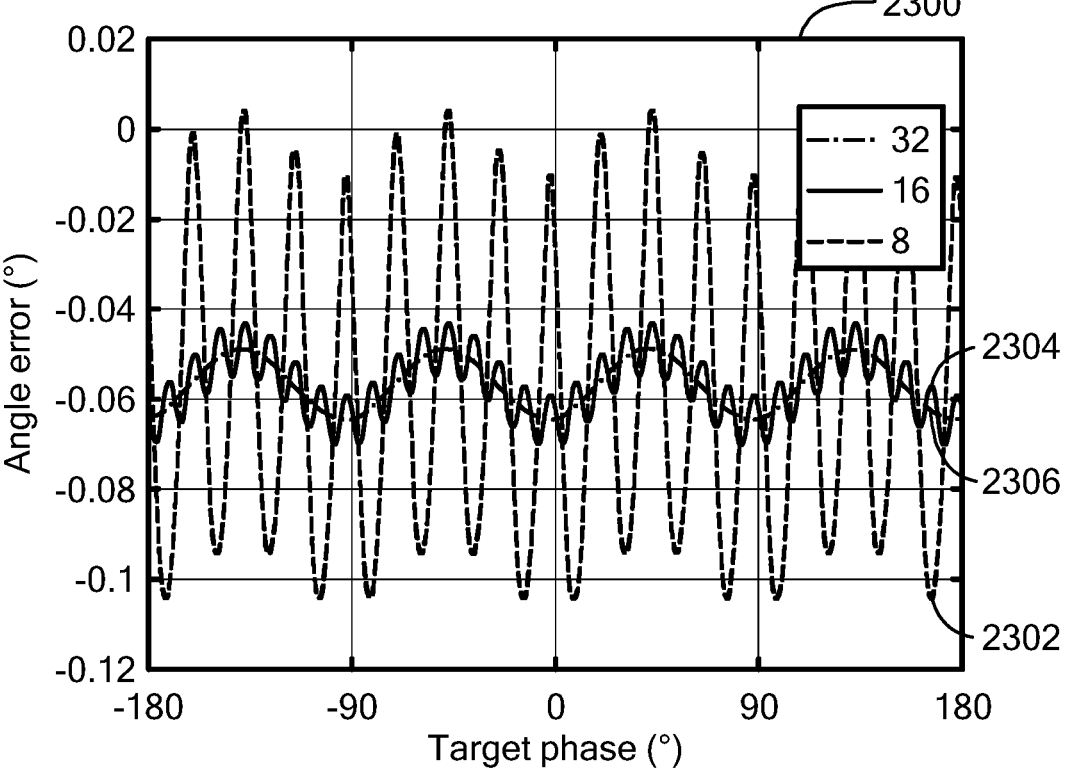
FIG. 23 is a graph of an example of angle error versus target phase for different number of magnetoresistance elements used.

Referring to FIG. 23, a graph 2300 depicts the target phase versus angle error for different numbers of magnetoresistance elements used. For example, a curve 2302 depicts using eight magnetoresistance elements, a curve 2304 depicts using sixteen magnetoresistance elements and a curve 2306 depicts using thirty-two magnetoresistance elements.

Figure 24:
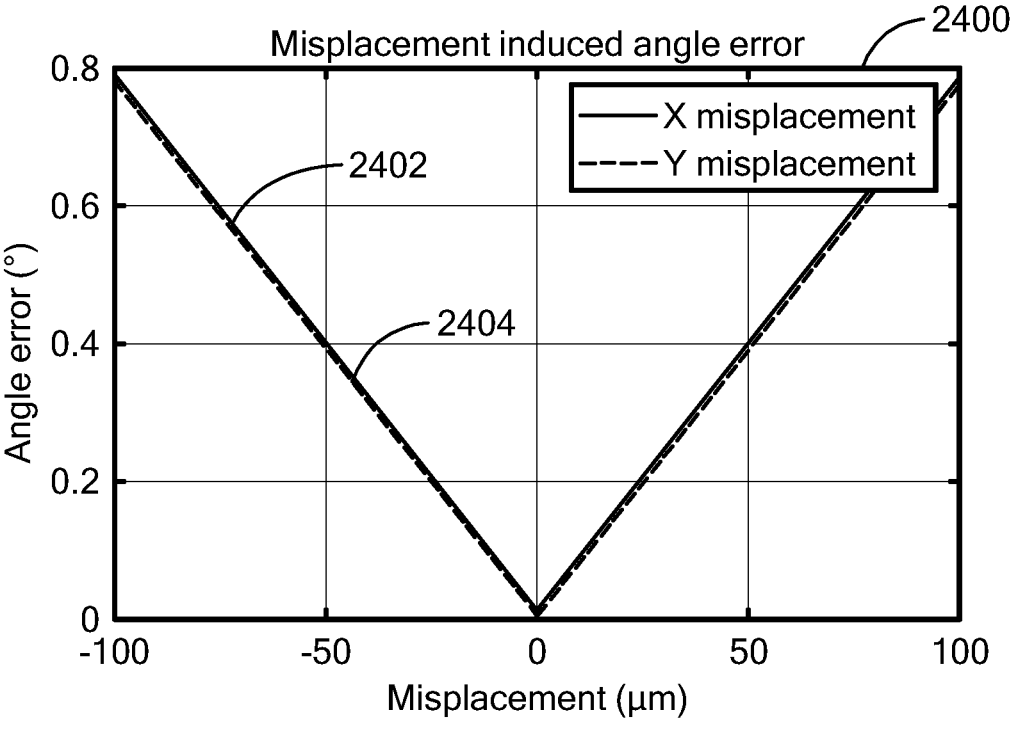
FIG. 24 is a graph of an example of misplacement induced angle error.

Referring to FIG. 24, a graph 2400 includes curves 2402, 2004. The curve 2402 shows the maximum angle error over a full rotation versus X-axis misplacement of the angle sensor. The curve 2404 shows the maximum angle error over a full rotation versus Y-axis misplacement of the angle sensor.

Figure 25:
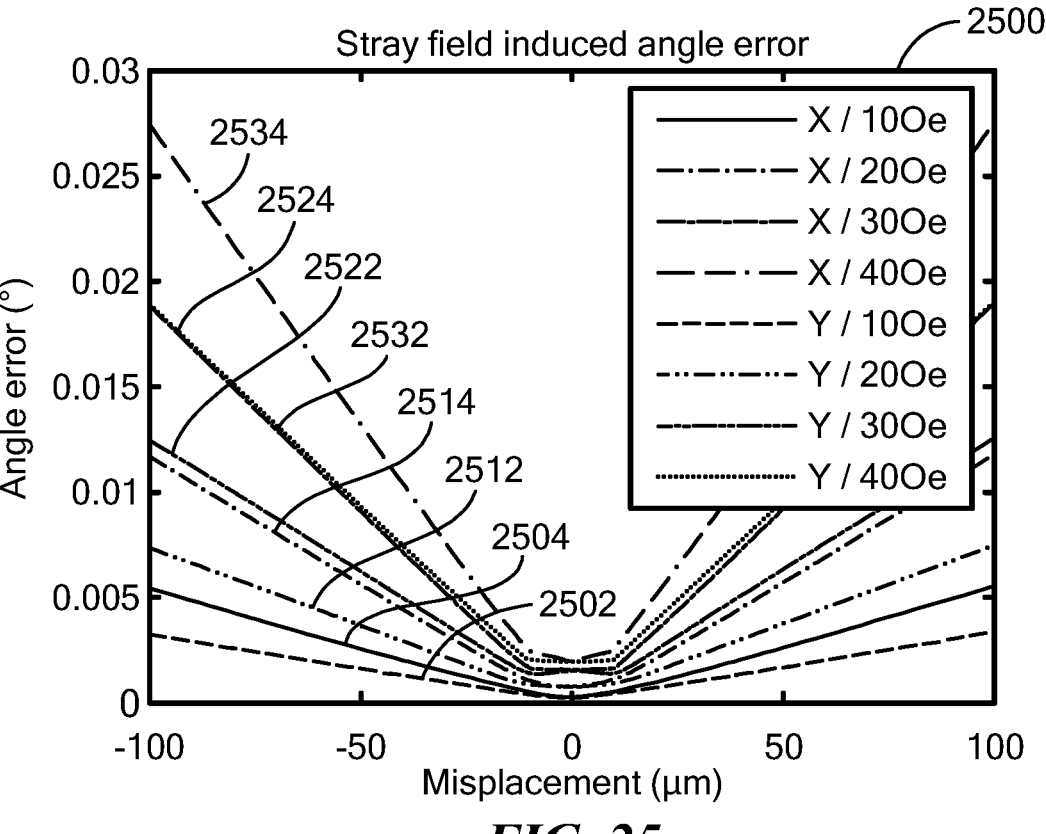
FIG. 25 is a graph of an example of stray magnetic field induced angle error for the configuration in FIG. 22.

Referring to FIG. 25, a graph 2500 depicts worse angle error due to different stray field amplitudes for different misplacements of the angle sensor from the center of the target. When compared to FIG. 24, the stray magnetic field induced error is lower than the accuracy before any corrections for misplacement of the sensor from the center of the magnet target (i.e., the center between the magnetized pole magnets 1102a, 1102b, 1104a, 1104b.

For example, a curve 2502 represents the maximum angle error due to a rotating 10 Oe stray field versus misplacement in the X-direction and a curve 2504 represents the maximum angle error due to a rotating 10 Oe stray field versus misplacement in the Y-direction, a curve 2512 represents the maximum angle error due to a rotating 20 Oe stray field versus misplacement in the X-direction and a curve 2514 represents the maximum angle error due to a rotating 20 Oe stray field versus misplacement in the Y-direction, a curve 2522 represents the maximum angle error due to a rotating 30 Oe stray field versus misplacement in the X-direction and a curve 2524 represents the maximum angle error due to a rotating 30 Oe stray field versus misplacement in the Y-direction, and a curve 2532 represents the maximum angle error due to a rotating 40 Oe stray field versus misplacement in the X-direction and a curve 2534 represents the maximum angle error due to a rotating 40 Oe stray field versus misplacement in the Y-direction.

An angle of rotation of the target θ can be achieved for the embodiments in FIGS. 13, 17 and 22. A mapping of the signal across the MR elements is acquired. After acquiring the mapping of signals across the MR elements, values are stored in a vector called Res. Then the following convolution operation can be run:

$$C = \sum_{i=1}^{N} Res_i \times e^{2i\pi X_i}$$

where N is the number of MR elements, $Res_i$ is the resistance (may be conductance also) of the $i^{th}$ MR element in the vector and $X_i$ is the angular position of the $i^{th}$ MR element on the die.

In this case C is computed as a complex number but the exact same results can be obtained by running two convolutions; one with a cosine (this would provide the real part of C) and one with a sine (this would provide the imaginary part of C). Also, the cosine and sine used for the convolution can be stored as two N elements vectors in memory to reduce algorithm execution time.

The angle of rotation of the target θ can be extracted with the following operation:

$$\theta = \arg(C)$$

$$\theta = \tan^{-1}\left(\frac{\mathrm{Im}(C)}{\mathrm{Re}(C)}\right).$$

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An angle sensor comprising:
a first linear sensor; and
a second linear sensor,
a first die having a first surface and an opposing second surface, the first linear sensor being disposed on the first surface of the first die;
a second die having a first surface and an opposing second surface, the second linear sensor being disposed on the second surface of the second die;
wherein a first magnetic-field direction of a target magnet measured by the first linear sensor is substantially equal to a second magnetic-field direction of the target magnet measured by the second linear sensor,
wherein the first linear sensor, the second linear sensor and the target magnet are on an axis,
wherein the angle sensor determines an angle of a magnetic field by:
detecting an amplitude and direction of a magnetic field at the first linear sensor and the second linear sensor; and
calculating a difference between the magnetic field detected at the first linear sensor and the second linear sensor; and
wherein the first linear sensor and the second linear sensor have a linear range equal to a maximum field range from the target magnet plus twice a maximum amplitude of a stray magnetic field, such that the first and second linear sensor each remain within a linear region, allowing the first linear sensor and the second linear sensor to avoid a saturation region.

2. The angle sensor of claim 1, wherein the first linear sensor is disposed along a first plane and the second linear sensor is disposed along a second plane; and
wherein the first plane and the second plane are each perpendicular to the axis.

3. The angle sensor of claim 2, wherein the target magnet is disposed along a third plane and the third plane is perpendicular to the axis.

4. The angle sensor of claim 1, wherein the first and second linear sensors are two-dimensional (2-D) sensors.

5. The angle sensor of claim 1, further comprising a spacer layer in direct contact with the second surface of the first die and the first surface of the second die.

6. The angle sensor of claim 5, wherein the spacer separates the first die from the second die by about 25 microns.

7. The angle sensor of claim 1, further comprising a printed circuit board (PCB) electrically connected to the first die by a wire.

8. The angle sensor of claim 7, wherein the second die is disposed in a flip-chip structure having solder balls in direct contact with the PCB.

9. The angle sensor of claim 1, wherein the first linear sensor and the second linear sensor are spaced apart by about 1 millimeter.

10. An angle sensor comprising:

a first linear sensor;

a second linear sensor;

a first die having a first surface and an opposing second surface, the first linear sensor being disposed on the first surface of the first die;

a second die having a first surface and an opposing second surface, the second linear sensor being disposed on the second surface of the second die;

a spacer layer in direct contact with the second surface of the first die and the first surface of the second die; and a printed circuit board (PCB) electrically connected to the first die by a wire, wherein a first magnetic-field direction of a target magnet measured by the first linear sensor is substantially equal to a second magnetic-field direction of the target magnet measured by the second linear sensor, wherein the first linear sensor, the second linear sensor and the target magnet are on an axis, and wherein the angle sensor determines an angle of a magnetic field by:

detecting an amplitude and direction of a magnetic field at the first linear sensor and the second linear sensor; and calculating a difference between the magnetic field detected at the first linear sensor and the second linear sensor, and wherein the first linear sensor and the second linear sensor have a linear range equal to a maximum field range from the target magnet plus twice a maximum amplitude of a stray magnetic field, such that the first and second linear sensor each remain within a linear region, allowing the first linear sensor and the second linear sensor to avoid a saturation region.

11. The angle sensor of claim 10, wherein the spacer separates the first die from the second die by about 25 microns.

12. The angle sensor of claim 10, wherein the second die is disposed in a flip-chip structure having solder balls in direct contact with the PCB.

13. The angle sensor of claim 10, wherein the first and second linear sensors are two-dimensional (2-D) sensors.

14. The angle sensor of claim 10, wherein the first linear sensor and the second linear sensor are spaced apart by about 1 millimeter.

15. The angle sensor of claim 10, wherein the first linear sensor and/or the second linear sensor includes a magnetoresistance element.

16. An angle sensor comprising:

a first linear sensor; and a second linear sensor, a first die having a first surface and an opposing second surface, the first linear sensor being disposed on the first surface of the first die;

a second die having a first surface and an opposing second surface, the second linear sensor being disposed on the second surface of the second die;

wherein a first magnetic-field direction of a target magnet measured by the first linear sensor is substantially equal to a second magnetic-field direction of the target magnet measured by the second linear sensor, wherein the first linear sensor, the second linear sensor and the target magnet are on an axis, wherein the angle sensor determines an angle of a magnetic field by:

detecting an amplitude and direction of a magnetic field at the first linear sensor and the second linear sensor; and calculating a difference between the magnetic field detected at the first linear sensor and the second linear sensor; and wherein the first linear sensor and the second linear sensor have a linear range equal to a maximum field range from the target magnet plus twice a maximum amplitude of a stray magnetic field, such that the first and second linear sensor each remain within a linear region, allowing the first linear sensor and the second linear sensor to avoid a saturation region.

17. The angle sensor of claim 16, wherein the first linear sensor is disposed along a first plane and the second linear sensor is disposed along a second plane; and wherein the first plane and the second plane are each perpendicular to the axis.

18. The angle sensor of claim 17, wherein the target magnet is disposed along a third plane and the third plane is perpendicular to the axis.

19. The angle sensor of claim 18, wherein the first and second linear sensors are two-dimensional (2-D) sensors.

* * * * *